United States Patent
Okada et al.

(10) Patent No.: US 10,634,887 B2
(45) Date of Patent: Apr. 28, 2020

(54) PROTECTIVE FILM, REFLECTIVE MEMBER, AND METHOD FOR PRODUCING PROTECTIVE FILM

(71) Applicant: AGC Inc., Tokyo (JP)

(72) Inventors: Naoko Okada, Tokyo (JP); Nobutaka Aomine, Tokyo (JP); Hiroshi Hanekawa, Tokyo (JP); Hirotomo Kawahara, Tokyo (JP)

(73) Assignee: AGC Inc., Tokyo (JP)

( * ) Notice: Subject to any disclaimer, the term of this patent is extended or adjusted under 35 U.S.C. 154(b) by 696 days.

(21) Appl. No.: 14/941,354

(22) Filed: Nov. 13, 2015

(65) Prior Publication Data

US 2016/0077320 A1 Mar. 17, 2016

Related U.S. Application Data

(63) Continuation of application No. PCT/JP2014/062736, filed on May 13, 2014.

(30) Foreign Application Priority Data

May 14, 2013 (JP) .................................. 2013-102074

(51) Int. Cl.
*G02B 5/08* (2006.01)
*G02B 5/22* (2006.01)
(Continued)

(52) U.S. Cl.
CPC .......... *G02B 19/0042* (2013.01); *C03C 17/36* (2013.01); *C03C 17/366* (2013.01); *C03C 17/3618* (2013.01); *C03C 17/3626* (2013.01); *C03C 17/3639* (2013.01); *C03C 17/3644* (2013.01); *C03C 17/3647* (2013.01); *C03C 17/3652* (2013.01); *C03C 17/3663* (2013.01);
(Continued)

(58) Field of Classification Search
CPC ............ G02B 1/105; G02B 5/223; B60R 1/12
USPC ......................................... 359/884, 885, 838
See application file for complete search history.

(56) References Cited

U.S. PATENT DOCUMENTS 5,019,458 A  5/1991 Elgat et al.
5,106,671 A * 4/1992 Amberger ......... B32B 17/10018
                                                    428/213

(Continued)

FOREIGN PATENT DOCUMENTS

EP  0 341 844 A2  11/1989
EP  1 111 087 A1   6/2001
(Continued)

OTHER PUBLICATIONS

International Search Report dated Jul. 14, 2014 in International Application No. PCT/JP2014/062736 filed May 13, 2014.
(Continued)

*Primary Examiner* — Dawayne Pinkney
(74) *Attorney, Agent, or Firm* — Oblon, McClelland, Maier & Neustadt, L.L.P.

(57) ABSTRACT

A protective film placed on an upper part of a metal film for protecting the metal film placed on a glass substrate. The protective film includes a silica film. The silica film has an extinction coefficient "k" less than or equal to $1\times10^{-4}$, a refractive index "n" greater than or equal to 1.466 at a wavelength of 632 nm, and a carbon content less than or equal to 3 atomic %.

18 Claims, 5 Drawing Sheets

(51) Int. Cl.
    *G02B 19/00*     (2006.01)
    *G02B 1/10*     (2015.01)
    *C23C 14/10*     (2006.01)
    *C23C 14/06*     (2006.01)
    *C23C 14/16*     (2006.01)
    *C03C 17/36*     (2006.01)
    *G02B 1/14*     (2015.01)
    *C23C 14/18*     (2006.01)
    *C23C 14/34*     (2006.01)
    *C23C 16/40*     (2006.01)
    *C23C 16/50*     (2006.01)

(52) U.S. Cl.
    CPC .......... *C23C 14/0641* (2013.01); *C23C 14/10* (2013.01); *C23C 14/165* (2013.01); *C23C 14/18* (2013.01); *C23C 14/34* (2013.01); *C23C 16/402* (2013.01); *C23C 16/50* (2013.01); *G02B 1/105* (2013.01); *G02B 1/14* (2015.01); *G02B 5/0808* (2013.01); *C03C 2218/153* (2013.01)

(56) References Cited

U.S. PATENT DOCUMENTS

| | | |
|---|---|---|
| 5,691,044 A | 11/1997 | Oyama et al. |
| 5,991,488 A * | 11/1999 | Salamon ............. G01N 21/553 385/11 |
| 6,287,430 B1 | 9/2001 | Matsumoto et al. |
| 2002/0090521 A1* | 7/2002 | Nakajima ............... C23C 16/30 428/446 |
| 2005/0008879 A1 | 1/2005 | Shin et al. |
| 2007/0178316 A1 | 8/2007 | Mellott |
| 2007/0281184 A1 | 12/2007 | Thiel |
| 2008/0131693 A1 | 6/2008 | Hiruma et al. |
| 2016/0122238 A1* | 5/2016 | Roquiny ............. C03C 17/3618 428/336 |

FOREIGN PATENT DOCUMENTS

| | | |
|---|---|---|
| EP | 1 918 740 A1 | 5/2008 |
| JP | H08-048369 | 2/1996 |
| JP | 11-34216 | 2/1999 |
| JP | 2000-356706 | 12/2000 |
| JP | 2002-162510 | 6/2002 |
| JP | 2006-10930 | 1/2006 |
| JP | 2009-101548 | 5/2009 |
| JP | 4768722 | 6/2011 |
| JP | 4928000 | 2/2012 |
| WO | WO 2007/089387 A1 | 8/2007 |
| WO | WO 2011/120595 A1 | 10/2011 |

OTHER PUBLICATIONS

Written Opinion dated Jul. 14, 2014 in International Application No. PCT/JP2014/062736 filed May 13, 2014.

* cited by examiner

PROTECTIVE FILM, REFLECTIVE MEMBER, AND METHOD FOR PRODUCING PROTECTIVE FILM

CROSS-REFERENCE TO RELATED APPLICATION

This application is a U.S. continuation application filed under 35 USC 111(a) claiming benefit under 35 USC 120 and 365(c) of PCT application PCT/JP2014/062736, filed on May 13, 2014, which claims priority to Application Ser. No. 2013-102074, filed in Japan on May 14, 2013. The foregoing applications are hereby incorporated herein by reference.

TECHNICAL FIELD

The present invention relates to a protective film, a reflective member, and a method for producing the protective film.

BACKGROUND ART

A mirror used for a solar power generation system or a reflective member such as low-E glass often includes a glass substrate having a metal reflective film arranged thereon. However, a metal reflective film used for a reflective member typically has a problem of heat resistance. Therefore, a protective film is often formed on the metal reflective film for preventing the metal reflective film from being degraded by oxidization.

For example, there is proposed a material using a metal reflective film having a silica film sputtered as its top coating (see Patent Document 1). Although the silica film is used for improving scratch resistance of the material, the silica film does not have a high density because the silica film is formed by sputtering. Thus, its effect as a film for preventing oxidization of the metal film is considered to be low.

Further, Patent Document 2 proposes that the heat resisting property is important for a film that protects a layer from heat and that a silica film alone has an insufficient heat resisting property. Thus, Patent Document 2 proposes to use a mixed film having a silica film doped with aluminum oxide. However, Patent Document 2 does not teach or suggest using only a silica film as a protective film having a sufficient heat resisting property.

Patent Documents 3 and 4 propose to form a gas barrier layer by forming multiple layers of silica on a plastic substrate by using a plasma CVD method. However, a product using the gas barrier layer is not expected to be used in a high temperature environment because no material other than plastic is taught to be used as the substrate.

PRIOR ART DOCUMENT

Patent Document

Patent Document 1: Japanese Registered Patent No. 4768722

Patent Document 2: Japanese Registered Patent No. 4928000

Patent Document 3: Japanese Laid-Open Patent Publication No. 8-48369

Patent Document 4: Japanese Laid-Open Patent Publication No. 2009-101548).

DISCLOSURE OF THE INVENTION

Problems to be Solved by the Invention

As described above, a protective film is typically formed on a metal reflective film of a reflective member for preventing degradation due to oxidization of the metal reflective film.

However, the protective film that is currently used does not sufficiently prevent oxidization of the metal reflective film.

For example, a secondary mirror used for a solar power system is exposed to a high temperature of 400° C. for a long period because the secondary mirror is placed in the vicinity of a heat storage member that stores solar thermal energy. Thus, a protective film is conventionally placed on the metal reflective film of a secondary mirror for a solar power system.

However, it is difficult for the conventional protective film to prevent oxidization of the metal reflective film for a long period. Therefore, the reflection characteristic gradually degrades as the secondary mirror is used for a long period.

Further, a protective film is also conventionally placed on a metal reflective film used for a low-E (Emissivity) glass. However, the metal reflective film is easily oxidized in a case where a thermal process (greater than or equal to approximately 600° C.) is performed on the low-E glass for the purpose of, for example, a glass strengthening process or a glass bending process. As a result, the reflection characteristic of the metal reflective film is degraded.

There is a large demand for a protective film capable of effectively preventing degradation of the reflective member due to oxidization of the metal reflective film.

In view of the above, an object according to an embodiment of the present invention is to provide a protective film capable of effectively preventing oxidization of a metal reflective film placed on a glass substrate. Further, another object according to an embodiment of the present invention is to provide a reflective member including such protective film. Yet another object according to an embodiment of the present invention is to provide a method for producing such protective film.

Means of Solving the Problems

In order to achieve the above-described objects, an embodiment of the present invention provides a protective film placed on an upper part of a metal film for protecting the metal film being placed on a glass substrate. The protective film includes a silica film. The silica film has an extinction coefficient "k" less than or equal to $1 \times 10^{-4}$ and a refractive index "n" greater than or equal to 1.466 at a wavelength of 632 nm, and a carbon content less than or equal to 3 atomic %.

Further, an embodiment of the present invention provides a reflective member including a glass substrate, a metal reflective film, and a protective film for protecting the metal reflective film. The protective film includes a silica film. The silica film has an extinction coefficient "k" less than or equal to $1 \times 10^{-4}$ and a refractive index "n" greater than or equal to 1.466 at a wavelength of 632 nm, and a carbon content less than or equal to 3 atomic %.

In the reflective member according to an embodiment of the present invention, the metal reflective film may include silver or a silver alloy.

The reflective member according to an embodiment of the present invention may further include at least a single film that is provided between the glass substrate and the metal reflective film, and selected from a group including a metal nitride, a metal oxide, and a metal oxynitride.

In the reflective member according to an embodiment of the present invention, a film having a refractive index higher than the silica film may be provided on a side of the silica film opposite from the metal reflective film.

In this case, the film having a refractive index higher than the silica film may be a silicon nitride film.

In the reflective member according to an embodiment of the present invention, the glass substrate may include a glass having a sodium oxide content of 4% or less by mass.

An embodiment of the present invention provides a low-E glass including the above-described reflective member.

An embodiment of the present invention provides a secondary mirror of a solar energy generating system including the above-described reflective member.

An embodiment of the present invention provides a method for producing a protective film provided on an upper part of a metal film placed on a glass substrate, the method including the steps of: (a) depositing a metal reflective film on an upper part of the glass substrate; and (b) depositing a silica film on an upper part of the metal reflective film, wherein the step (b) is performed by a plasma CVD method in a condition in which a pressure is less than or equal to 2 Pa.

In the method according to an embodiment of the present invention, the silica film deposited in the step (b) may have an extinction coefficient "k" less than or equal to $1\times10^{-4}$ and a refractive index "n" greater than or equal to 1.466 at a wavelength of 632 nm, and a carbon content less than or equal to 3 atomic %.

In the method according to an embodiment of the present invention, the step (a) may be performed by a sputtering method.

In the method according to an embodiment of the present invention, the steps (a) and (b) may be performed by an inline method.

In the method according to an embodiment of the present invention, the metal reflective film may include a silver or a silver alloy.

The method according to an embodiment of the present invention may further include a step of: (c) forming a film that has a refractive index higher than the silica film on an upper part of the silica film.

In the method according to an embodiment of the present invention, the film having a refractive index higher than the silica film may be a silicon nitride film.

Effect of the Invention

An embodiment of the present invention can provide a protective film capable of effectively preventing oxidization of a metal reflective film placed on a glass substrate. Further, another embodiment of the present invention can provide a reflective member having such protective film. Yet another embodiment of the present invention can provide a method for producing such protective film.

EMBODIMENTS FOR CARRYING OUT THE INVENTION

Figure 1:
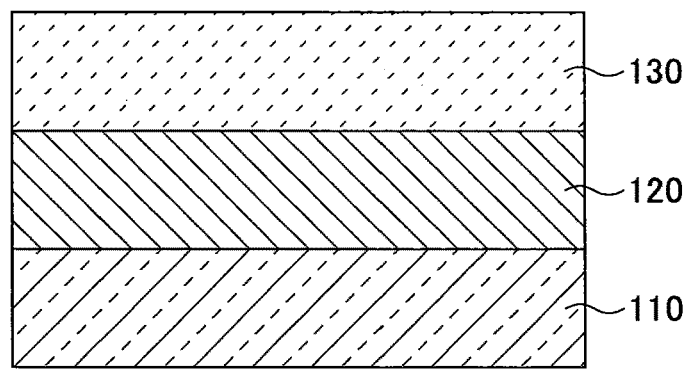
FIG. 1 is a schematic diagram illustrating a cross section of a reflective member according to an embodiment of the present invention.

Next, embodiments of the present invention are described in detail with reference to the accompanying drawings.

An embodiment of the present invention provides a protective film placed on an upper part of a metal film for protecting the metal film being placed on a glass substrate. The protective film includes a silica film. The silica film has an extinction coefficient "k" less than or equal to $1\times10^{-4}$, a refractive index "n" greater than or equal to 1.466 at a wavelength of 632 nm, and a carbon content that is less than or equal to 3 atomic %.

As described above, the conventional protective film used for a reflective member or the like cannot sufficiently prevent a metal film from being degraded by heat.

In contrast, a protective film according to an embodiment of the present invention has a characteristic of being formed as a dense silica film.

In a case where such a silica film is used, a satisfactory oxygen barrier property of the silica film significantly prevents the oxygen in the atmosphere from entering the inside of the silica film. Therefore, the protective film of this embodiment can significantly prevent oxidization of a metal film in a case where the metal film is used for a long period in a high temperature of, for example, approximately 400° C. or even in a case where the metal film is used for a short period when thermally processing a glass substrate in a high temperature of, for example, approximately 700° C. Accordingly, in a case where the protective film of this embodiment is used on, for example, a reflective member, the degrading of the reflective member can be significantly prevented, and the characteristics of a metal film can be maintained even in a high temperature.

It is to be noted that quantitatively expressing the density of a silica film is, in general, difficult. Therefore, in the present application, the refractive index "n" is used as an index for quantitatively expressing the density of a silica film.

As described in the following embodiments, the inventors of the present application have found that a more satisfactory oxygen barrier property can be attained the higher the refractive indices "n" of silica films are in a case where the silica films have the same light absorption characteristics. Therefore, the oxygen barrier property of a silica film as well as the density of a silica film can be expressed by the refractive index "n" of the silica film. It is to be noted that the density of a silica film is more satisfactory, the higher the refractive index "n" of the silica film is.

The light absorption characteristic of a silica film is an important parameter for a reflective member. This is because increasing the amount of light radiated from the silica film becomes difficult due to more light being reflected at the metal film as the light absorption of a silica film becomes greater.

Therefore, in the present application, the light absorption characteristic of a silica film is defined by using an extinction coefficient "k". The extinction coefficient "k" is a parameter for expressing the absorption of light. A silica film has a lower light absorption property as the extinction coefficient "k" of the silica film becomes smaller.

Further, an impurity existing inside a silica film is another factor that affects the density and light absorption characteristics of a silica film. For example, in a case where a silica film is deposited by a CVD (Chemical Vapor Deposition) method, an organic metal compound gas such as tetramethyldisiloxane is typically used as a source gas. However, the carbon originating from the organic metal compound gas is trapped inside the deposited silica film and degrades the density of the silica film. Although the carbon inside the silica film degrades the density of the silica film, the carbon may be a factor for increasing the value of the refractive index of a silica film because carbon has a greater refractive index than the refractive index of the silica film. Therefore, a silica film having satisfactory density should have a small amount of carbon existing inside the silica film and a high refractive index "n".

Accordingly, a protective film according to an embodiment of the present invention includes a silica film, having an extinction coefficient "k" less than or equal to $1 \times 10^{-4}$ and a refractive index "n" greater than or equal to 1.466 at a wavelength of 632 nm, and a carbon content less than or equal to 3 atomic %.

Owing to the protective film having such characteristics, a metal film can be prevented from oxidizing in a high temperature atmosphere. Further, the light absorption of the protective film can be significantly restrained. Therefore, in a case where the protective film of this embodiment is used as a reflective member, the heat resisting property of the reflective member can be significantly improved, and the reflective member can maintain a satisfactory reflection characteristic for a long period.

The refractive index "n" of the protective film at a wavelength of 632 nm may be, for example, greater than or equal to 1.469, and preferably, greater than or equal to 1.47. Further, the extinction coefficient "k" of the protective film may be, for example, less than or equal to $1 \times 10^{-5}$, and preferably, less than or equal to $1 \times 10^{-6}$. Further, the carbon content of the protective film may be, less than or equal to 2 atomic %, and preferably, less than or equal to 1 atomic %.

Next, a reflective member according to an embodiment of the present invention is described.

<Reflective Member According to Embodiment of Present Invention>

FIG. 1 is a schematic view illustrating a cross section of a reflective member according to an embodiment of the present invention.

As illustrated in FIG. 1, a reflective member 100 according to an embodiment of the present invention has a metal reflective film 120 and a protective film 130 placed on an upper part of a glass substrate 110.

As described above, the reflection characteristic of a typical reflective member is known to degrade gradually when the reflective member is used for a long period in a high temperature atmosphere (e.g., 400° C.). Further, even in a case where the reflective member is used for a short period, the reflection characteristic of the reflective member degrades in a high temperature of approximately 700° C. Further, oxidization of the metal reflective film is considered to be a cause of the degradation of the reflection characteristic, in which oxygen in the atmosphere gradually enters the inside of the reflective member from the side of the protective film.

On the other hand, the protective film 130 of the reflective member 100 according to an embodiment of the present invention is formed of a dense silica film for preventing the oxygen in the atmosphere from entering the inside of the reflective member 100.

In a case where the protective film 130 is used, the satisfactory oxygen barrier property of the protective film 130 can significantly prevent the oxygen in the atmosphere from entering the inside (side of the metal reflective film 120) by way of the protective film 130. Therefore, the reflective member 100 according to an embodiment of the present invention can significantly prevent oxidization of the metal film 120 in a case where the reflective member 100 is used for a long period in a high temperature or even in a case where the reflective member 100 is used for a short period in a high temperature of approximately 700° C. Accordingly, the reflection characteristic of the reflective member 100 is significantly prevented from degrading.

Particularly, the protective film 130 has a characteristic of including a silica film having an extinction coefficient "k" less than or equal to $1 \times 10^{-4}$ and a refractive index "n" greater than or equal to 1.466 at a wavelength of 632 nm. Further, the silica film of the protective film 130 has a carbon content less than or equal to 3 atomic %.

By using the protective film 130 having such characteristics, the metal reflective film 120 can be significantly prevented from oxidizing in a high temperature atmosphere, and light can be significantly prevented from being absorbed by the protective film 130. Accordingly, the high temperature heat resisting property of the reflective member 100 can be significantly improved, and a satisfactory reflective property can be maintained for a long period. Further, a satisfactory reflection property can be maintained even after a thermal strengthening process is performed on the reflective member 100.

The refractive index "n" of the protective film at a wavelength of 632 nm may be, for example, greater than or equal to 1.469, and preferably, greater than or equal to 1.47. Further, the extinction coefficient "k" of the protective film may be, for example, less than or equal to $1 \times 10^{-5}$, and preferably, less than or equal to $1 \times 10^{-6}$. Further, the carbon content of the protective film may be, less than or equal to 2 atomic %, and preferably, less than or equal to 1 atomic %.

Hence, although characteristics of the reflective member 100 according to an embodiment of the present invention are described above, the configuration of the reflective member of the present invention is not limited to the above-described embodiment.

For example, in the embodiment of the reflective member 100 illustrated in FIG. 1, another layer may be disposed in-between the glass substrate 110 and the metal reflective film 120, in-between the metal reflective film 120 and the protective film 130, or on the upper part of the protective film 130. From this aspect, the configuration of the reflective member 100 illustrated in FIG. 1 is a structure illustrating minimal layers, that is, a basic structure of the reflective member of the present invention.

Further, the metal reflective film 120 does not necessarily need to be formed of a single layer. The metal reflective film 120 may be formed of multiple layers of different materials and/or compositions.

<Method for Producing Reflective Member According to Embodiment of Present Invention>

Next, a method for producing the reflective member 100 (illustrated in FIG. 1) according to an embodiment of the present invention is described. The below-described method is merely one example for producing the reflective member 100. The reflective member 100 may be produced by using other methods.

Figure 2:
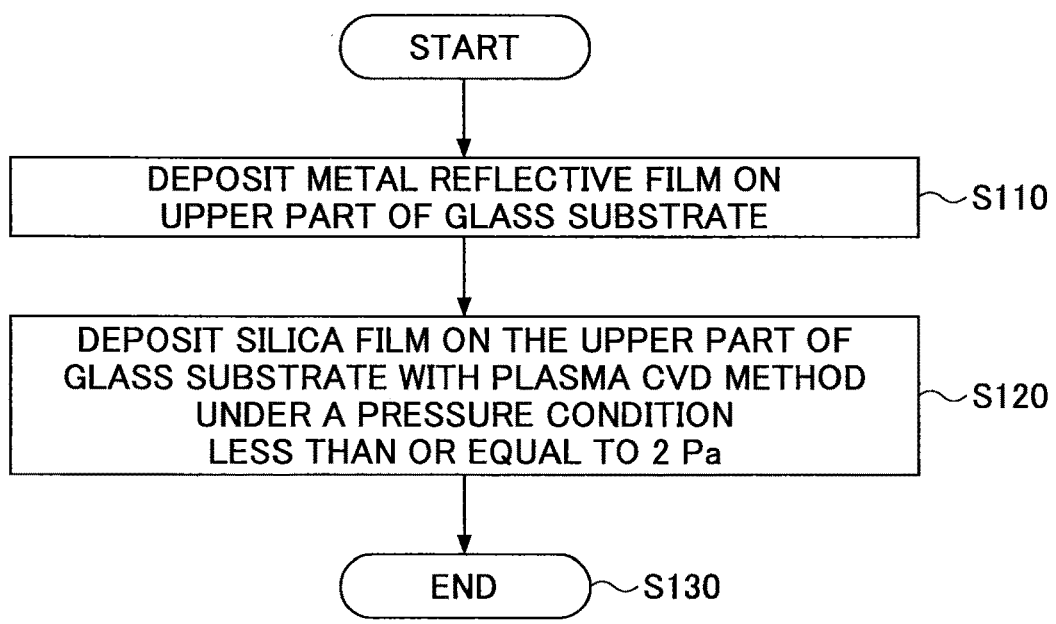
FIG. 2 is a schematic diagram illustrating the flow of a method for producing a reflective member according to an embodiment of the present invention.

FIG. 2 is a flowchart illustrating a method for producing the reflective member 100 according to an embodiment of the present invention.

As illustrated in FIG. 2, the producing method includes: (a) a step of depositing a metal reflective film on an upper part of a glass substrate (Step S110); and (b) a step of depositing a silica film on the upper part of the metal reflective film by using a plasma CVD method at a pressure condition less than or equal to 2 Pa (Step S120). Each step is described in detail below.

<Step S110>

First, a glass substrate is prepared. The composition of the glass substrate is not limited in particular.

Then, a metal reflective film is deposited on the glass substrate. The method for depositing the metal reflective film is not limited in particular. The material of the metal reflective film is not limited in particular as long as an appropriate reflectance can be exhibited by the reflective member that is produced.

For example, the metal reflective film may be deposited by a sputtering method or a vapor deposition method. The thickness of the metal reflective film may be, for example, greater than or equal to 50 Å. The upper limit of the thickness of the metal reflective film is not limited in particular. The metal reflective film may be formed of a single layer or multiple layers.

<Step S120>

Then, a protective film made of silica (silica film) is deposited on an upper part of the metal reflective film obtained in Step S110.

In this embodiment, the silica film is deposited by a plasma CVD method. The deposition pressure during the deposition process is less than or equal to 2 Pa. The deposition pressure is preferably less than or equal to 1 Pa, and more preferably less than or equal to 0.5 Pa.

The Steps S110 and S120 may be performed in an in-line system. By performing the steps in the in-line system, the production process can be simplified, and a large area can be deposited. Thus, productivity can be increased. By performing the sputtering deposition and the CVD deposition inside the same chamber in the in-line system, oxidization and degradation of the metal film can be prevented.

By depositing the silica film under the above-described conditions, there can be obtained a protective film having an extinction coefficient "k" less than or equal to $1 \times 10^{-4}$ and a refractive index "n" greater than or equal to 1.466 at a wavelength of 632 nm, and having a carbon content less than or equal to 3 atomic %. Further, by forming the protective film on the upper part of the metal reflective film, the protective film can exhibit an oxygen barrier effect. Thus, oxidization of the metal reflective film can be prevented when using the finally produced reflective member.

Other conditions in performing the CVD process are not limited in particular.

For example, the source gas is not limited in particular. The source gas used may be, for example, a mixed gas including oxygen and tetramethyldisiloxyane (TMDSO). In this case, the volume ratio between oxygen and TMDSO may range from 100:3 to 100:15.

Further, the power of the plasma used may be range from 15 kW/m to 100 kW/m.

The film thickness of the silica film is, for example, greater than or equal to 150 Å. The upper limit of the silica film is not limited in particular.

By performing the above-described steps, the embodiment of the reflective member 100 illustrated in FIG. 1 can be produced.

<Applied Example of Reflective Member of Present Invention>

Next, an applied example of a reflective member including the above-described characteristics is described with reference to the accompanying drawings.

Figure 3:
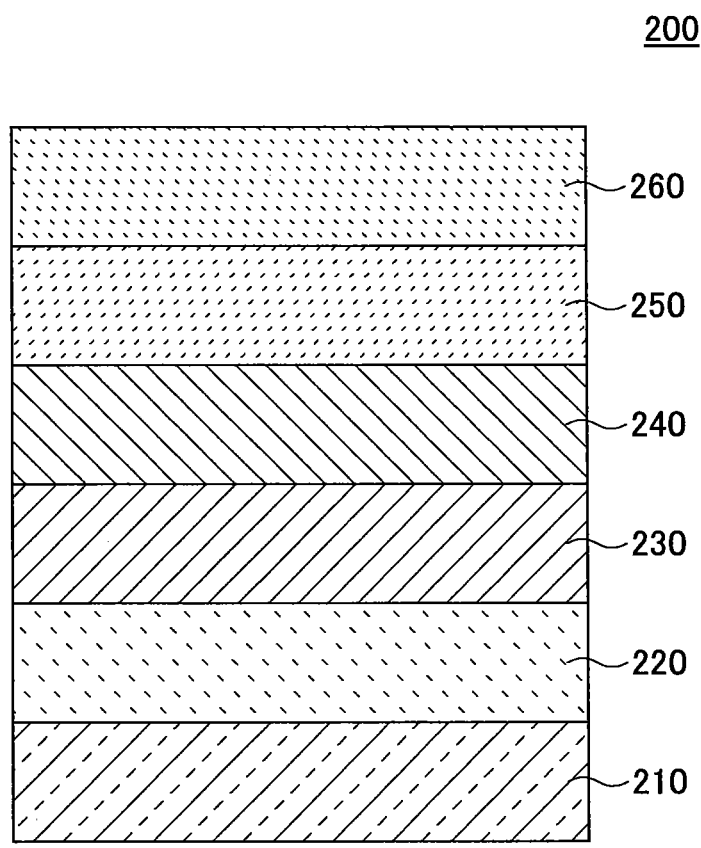
FIG. 3 is a schematic diagram illustrating a cross section of a low-E glass according to an embodiment of the present invention.

FIG. 3 illustrates a configuration of a low-E glass.

A low-E glass 200 illustrated in FIG. 3 includes a glass substrate 210, a first layer 220, a second layer 230, a third layer 240, a fourth layer 250, and a fifth layer 260, layered in this order.

The type of the glass substrate 210 is not limited in particular.

The first layer 220 is placed for improving the adhesiveness between the glass substrate 210 and the second layer 230 and for improving the transmittance in the visible light region of the Low-E glass 200. The first layer 220 may include, for example, a metal nitride, a metal oxide, and/or a metal oxynitride.

Because the second layer 230 has a role of significantly reflecting solar light in a long wavelength region (more specifically, a wavelength region that is greater than or equal to 800 nm) and further reducing emissivity, the second layer 230 includes a metal reflective film.

The third layer 240 has a role of preventing oxygen in the atmosphere from spreading into the second layer 230 when depositing the fourth layer 250. The third layer 240 may include, for example, a metal film, a metal nitride film, a metal oxide film, or a metal oxynitride film. However, the third layer 240 is not a requisite member and may be omitted in some cases.

The fourth layer 250 is formed as a film for preventing oxidization of the second layer 230 and the third layer 240. The fourth layer 250 includes a protective film made of silica (silica film).

The fifth layer 260 is formed as a dielectric film having a high refractive index. By forming the fifth layer 260 having a high refractive index on the fourth layer 250, the transmittance of visible light in the entire low-E glass 200 can be improved. Further, the reflectance of solar light in the long wavelength range (more specifically, a wavelength range that is greater than or equal to 800 nm) of the low-E glass 200 can be significantly increased. In some cases, the fifth layer 260 is formed for improving scratch resistance.

The low-E glass 200 includes a part corresponding to the "basic structure of the reflective member of the present invention" described above with reference to FIG. 1. That is, the glass substrate 210, the second layer 230, and the fourth layer 250 of the low-E glass 200 correspond to the glass substrate 110, the metal reflective film 120, and the protective film 130 of the reflective member 100 of FIG. 1, respectively.

Further, the low-E glass may further have the first-to fifth layers repeatedly placed on top of the configuration illustrated in FIG. 3. By forming the layers repeatedly, the low-E glass can significantly reflect solar light in a long wavelength region (more specifically, a wavelength region that is greater than or equal to 800 nm) and further reduce emissivity.

The low-E glass obtained by the repeated configuration is roughly described below.

The glass substrate, the first layer, the second layer, the third layer, the fourth layer, and the fifth layer illustrated in FIG. 3 are layered in this order. Then, a sixth layer similar to the first layer of FIG. 3, including, for example, metal nitride, metal oxide, and/or metal oxynitride is formed on the fifth layer. Then, a seventh layer similar to the second layer of FIG. 3, including a metal reflective film is formed on the sixth layer. Then, an eighth layer similar to the third layer of FIG. 3, including a metal film, a metal nitride film, a metal oxide film, or a metal oxynitride film is formed on the seventh layer. Then, a ninth layer similar to the fourth layer of FIG. 3, including a silica film is formed on the eighth layer. Then, a tenth layer similar to the fifth layer of FIG. 3, including a dielectric film having a high refractive index is formed on the ninth layer. Thereby, the reflectance in the wavelength region greater than or equal to 800 nm can be increased and emissivity can be lowered compared to the low-E glass of FIG. 3.

Similar to the third layer, the seventh layer is not a requisite member and may be omitted. Further, the eighth layer may be omitted in a case where there is the fourth layer. Further, the fourth layer may be omitted in a case where there is the eighth layer.

The low-E glass including the repeated configuration may further have the first to fifth layers of FIG. 3 placed on top of a tenth layer in this order, so that the low-E glass can significantly reflect solar light in a long wavelength region (more specifically, a wavelength region that is greater than or equal to 800 nm) and further reduce emissivity.

The repetitions are preferably two or three times. The repetitions can increase the reflectance in a wavelength region that is greater than or equal to 800 nm and reduce emissivity without significantly reducing the transmittance of visible light. Because visible light is transmitted while light in an infrared region of 800 nm or more is reflected, a window glass having satisfactory heat insulating or heat shielding properties can be obtained.

In a case where a thermal process is performed on a conventional low-E glass for the purpose of, for example, glass strengthening, a film including metal (such as the second layer 230 and/or the third layer 240) may be oxidized by oxygen on the atmosphere side of the low-E glass. Particularly, in a case where the oxidization of metal occurs in the second layer 230 that has a direct effect on the reflection property of the low-E glass, the reflection property of the low-E glass is significantly degraded.

On the other hand, the low-E glass 200 illustrated in FIG. 3 includes the "basic structure of the reflective member of the present invention". Therefore, in such a case, the environmental oxygen can be significantly prevented from passing through the fourth layer 250 and reaching the second layer 230 owing to the above-described effect of the protective film, that is, the oxygen barrier property of the fourth layer 250.

Accordingly, with the low-E glass 200, oxidization of the second layer 230 can be significantly prevented even in a case of performing a thermal process for a strengthening process. Thereby, the reflection property of the low-E glass 200 can be significantly prevented from degrading.

It is to be noted that the method described above with reference to FIG. 2 may be applied when producing the low-E glass 200.

For example, the low-E glass 200 may be produced by forming the first layer 220 by a sputtering method, forming the second layer 230 by a sputtering method, depositing the third layer 240 by a sputtering method, depositing the fourth layer 250 by a plasma CVD method, and depositing the fifth layer 260 by a sputtering method. The deposition pressure when depositing the fourth layer 250 by the plasma CVD method is less than or equal to 2 Pa. Alternatively, the deposition pressure may be less than or equal to 1 Pa.

The low-E glass 200 may, however, be produced by using other methods. For example, the first layer 220 to the third layer 240, and the fifth layer 260 do not necessarily need to be deposited by a sputtering method but may be deposited by using other methods such as an evaporation method.

<Respective Members Included in Low-E Glass>

Next, respective members included in the low-E glass 200 are described in detail. One of ordinary skill in the art can expressly understand that the respective members included in the reflective member 100 illustrated in FIG. 1 (i.e., glass substrate 110, metal reflective film 120, and protective film 130) may also be applied to the following description.

<Glass Substrate 210>

The type of the glass substrate 210 is not limited in particular.

The thickness of the glass substrate 210 is not limited in particular. However, from the aspect of strength, the aspect of facilitating a thermal strengthening process or a bending process, or the aspect of usability, the thickness of the glass substrate 210 may, for example, range from 2.0 mm to 8.0 mm.

The shape of the glass substrate 210 is not limited in particular. The glass substrate 210 may have a planar shape or a curved shape.

<First Layer 220>

As described above, the first layer 220 has a role of improving the adhesiveness between the glass substrate 210 and the second layer 230 and further improving the transmittance in the visible light region of the low-E glass 200.

The first layer 220 includes at least one of a group including a metal nitride, a metal oxide, and a metal oxynitride. For example, the first layer 220 may include zinc oxide. Further, in this case, the zinc oxide may be doped with at least one element in a group including aluminum, titanium, gallium, and tin.

The first layer 220 has a thickness greater than or equal to 150 Å. The upper limit of the thickness of the first layer 220 is not limited in particular. The first layer 220 may be formed of a single layer or multiple layers.

<Second Layer 230>

As described above, the second layer 230 is a layer including a metal reflective film, and the light reaching the second layer 230 is reflected at this layer. Further, emissivity is reduced by providing the second layer 230, so that a low-E glass can be produced.

The metal reflective film included in the second layer 230 may include, for example, silver or a silver alloy. The silver alloy may be an alloy including silver and at least one element selected from a group including gold, palladium, copper, nickel, silicon, aluminum, titanium, and chrome. In this case, the metal content of the silver alloy (other than silver) may range from 0.5% to 10% by mass.

In a case where silver or a silver alloy is included in the second layer 230, a low-E glass having low emissivity can be produced. The reflectance of solar light in the long wavelength region (greater than or equal to 800 nm) improves at the second layer 130 and the transmittance in the visible light region also improves at the second layer 130.

The second layer 230 may have a thickness ranging from, for example, 50 Å to 250 Å. The second layer 230 may be a formed of a single layer or multiple layers.

<Third Layer 240>

As described above, the third layer 240 has a role of preventing the oxygen in the atmosphere from spreading to the second layer 230 when depositing the fourth layer 250.

The third layer 240 may include an oxide film. In this case, the oxide film may include zinc oxide. Further, in this case, the zinc oxide may be doped with at least one element selected from a group including aluminum, titanium, gallium, and tin. Further, the oxide film may include titanium oxide.

Further, the third layer 240 may include a metal layer. For example, the third layer may include at least one metal selected from a group including zinc, titanium, nickel, chrome, tin, palladium, gold, and aluminum.

Among these metals, titanium and zinc are preferable. In the case of zinc, the metal layer may include zinc and be doped with at least one element selected from a group including titanium, aluminum, tin, and gallium.

Further, the third layer 240 may include a nitride layer. For example, the third layer 240 may include at least one nitride film selected from a group including a silicon nitride film, an aluminum nitride film, a chrome nitride film, a nickel nitride film, and a titanium nitride film. In this case, the nitride layer may include oxygen.

The third layer 240 may be formed of a single layer or multiple layers.

The third layer 240 may have a thickness ranging from, for example, 5 Å to 150 Å or from 5 Å to 180 Å.

It is to be noted that the third layer 240 is not a requisite member and may be omitted. Particularly, in a case of the embodiment of the low-E glass 200, the fourth layer 250 that is formed in a subsequent process includes the silica film having the above-described characteristics. Therefore, even in a case where the third layer 240 is omitted, the second layer 230 can be significantly prevented from being oxidized owing to the oxygen barrier property of the fourth layer 250.

<Fourth Layer 250>

The fourth layer 250 includes a material having a lower refractive index than the fifth layer 260. The fourth layer 250 includes a silica film.

As described above, the silica film has an extinction coefficient "k" less than or equal to $1\times10^{-4}$ and a refractive index "n" greater than or equal to 1.466 at a wavelength of 632 nm. Further, the silica film has a carbon content less than or equal to 3 atomic %. Thereby, the fourth layer 250 can exhibit density, that is, an oxygen barrier property, and significantly prevent oxidization of the second layer 230. Thus, the heat resisting property of the low-E glass 200 can be increased even in a high temperature.

The fourth layer 250 may have a film thickness ranging from, for example, 50 Å to 1500 Å.

<Fifth Layer 260>

The fifth layer 260 includes a material having a higher refractive index than the fourth layer 250. For example, the fifth layer 260 may have optical constants such as a refractive index "n" greater than or equal to 1.7 and an extinction coefficient "k" less than or equal to 0.01 at a wavelength of 550 nm.

The material included in the fifth layer 260 is not limited in particular as long as the above-described conditions are satisfied. The fifth layer 260 may include, for example, silicon nitride, aluminum nitride, titanium nitride, silicon oxynitride, aluminum oxynitride, titanium oxynitride, niobium oxide, zirconium oxide, tantalum oxide, hafnium oxide, titanium oxide, zinc oxide, and/or tin oxide. Further, the fifth layer 260 may include a complex oxynitride.

Among these materials, zinc oxide or tin oxide is preferred to be included in the fifth layer 260. The zinc oxide may be doped with at least one element selected from a group including aluminum, tin, and titanium. The tin oxide may be doped with zinc. Further, silicon nitride or a titanium nitride may be deposited. In a case where the fifth layer 260 includes silicon nitride or titanium nitride, the fifth layer 260 exhibits an effect of preventing the oxygen in the atmosphere from entering the inside of the low-E glass 200. Accordingly, in this case, the oxidization of the second layer is further prevented owing to the oxygen barrier effects of both the fourth layer 250 and the fifth layer 260. The silicon nitride may be doped with aluminum.

The fifth layer 260 may have a thickness ranging from 50 Å to 1500 Å. Further, the fifth layer 260 may be formed of a single layer or multiple layers.

Hence, in a case where a thermal process is performed on a conventional low-E glass in a high temperature for the purpose of, for example, glass strengthening, a film including metal (such as the second layer 230 and/or the third layer 240) may be oxidized by oxygen on the atmosphere side of the low-E glass. Particularly, in a case where the oxidization of metal occurs in the second layer 230 that has a direct effect on the reflection property of the low-E glass, the reflection property of the low-E glass is significantly degraded.

On the other hand, the low-E glass 200 illustrated in FIG. 3 includes the "basic structure of the reflective member of the present invention". Therefore, in such a case, the oxygen on the atmosphere side can be significantly prevented from passing through the fourth layer 250 and reaching the second layer 230 owing to the above-described effect of the protective film, that is, the oxygen barrier property of the fourth layer 250.

Accordingly, with the low-E glass 200, oxidization of the second layer 230 can be significantly prevented even in a case of performing a thermal process for a strengthening process. Thereby, the reflection property of the low-E glass 200 can be significantly prevented from degrading.

<Another Applied Example of Reflective Member According to Embodiment of Present Invention>

Next, another applied example of a reflective member having the above-described characteristics is described with reference to FIG. 4.

Figure 4:
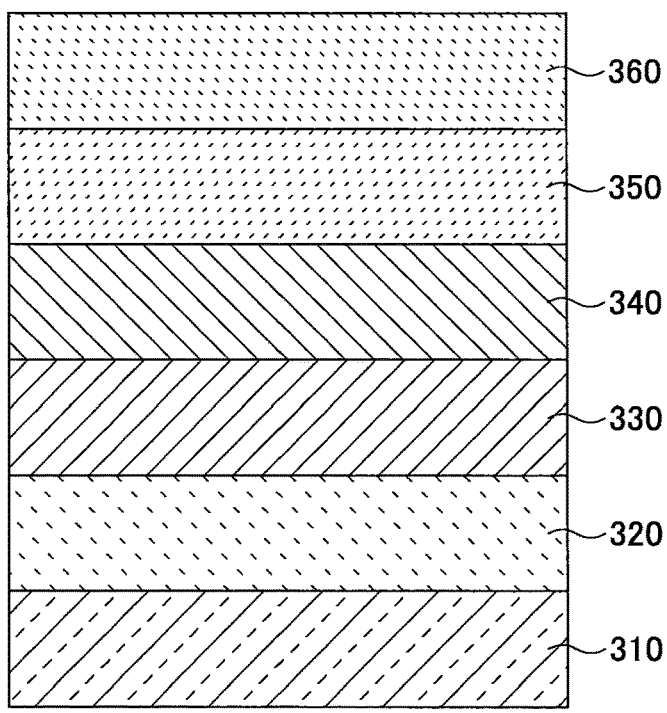
FIG. 4 is a schematic diagram illustrating a cross section of a mirror apparatus according to an embodiment of the present invention.

FIG. 4 is a schematic diagram illustrating a configuration of a mirror apparatus.

As illustrated in FIG. 4, a mirror apparatus 300 has a glass substrate 310, a first layer 320, a second layer 330, a third layer 340, a fourth layer 350, and a fifth layer 360 that are layered in this order.

The first layer 320 is placed for increasing the adhesiveness between the glass substrate 310 and the second layer 330. The first layer 320 may include, for example, a metal nitride, a metal oxide, and/or a metal oxynitride. The first layer 320 is not a requisite member and may be omitted.

The second layer 330 has a role of significantly reflecting light in a wavelength region of solar light. The second layer 330 includes a metal reflective film.

The third layer 340 has a role of preventing the oxygen in the atmosphere from spreading to the second layer 330 when depositing the fourth layer 350. However, the third layer 330 is not a requisite member and may be omitted.

The fourth layer 350 having a refractive index lower than the fifth layer 360 is formed as a low refractive index film. The fourth layer 350 includes a protective film made of silica (silica film).

The fifth layer 360 having a refractive index higher than the fourth layer 350 is formed as a high refractive index film. By layering the fifth layer 360 having a high refractive index on the fourth layer 350 having a low refractive index, the reflectance of the entire mirror apparatus 300 can be significantly increased.

<Respective Members Included in Mirror Apparatus>

Next, respective members included in the mirror apparatus 300 are described in detail. It is expressly understood for one of ordinary skill in the art that the respective members included in the reflective member 100 illustrated in FIG. 1 (i.e., glass substrate 110, metal reflective film 120, and protective film 130) may also be applied to the following description.

<Glass Substrate 310>

The type of the glass substrate 310 is not limited in particular as long as the glass substrate 310 has a $Na_2O$ content that is less than or equal to 4% by mass. The glass substrate 210 may be, for example, a non-alkali metal glass or AN100.

The thickness of the glass substrate 310 is not limited in particular. However, from the aspect of strength or the aspect of usability, the thickness of the glass substrate 310 may, for example, range from 0.5 mm to 8.0 mm.

The shape of the glass substrate 310 is not limited in particular. The glass substrate 310 may have a planar shape or a curved shape.

<First Layer 320>

As described above, the first layer 320 has a role of improving the adhesiveness between the glass substrate 310 and the second layer 330.

The first layer 320 includes at least one selected from a group including a metal nitride, a metal oxide, and a metal oxynitride. For example, the first layer 220 may include zinc oxide. Further, in this case, the zinc oxide may be doped with at least one element in a group including aluminum, titanium, gallium, and tin.

The first layer 320 has a thickness greater than or equal to 100 Å. The upper limit of the thickness of the first layer 320 is not limited in particular. The first layer 320 may be formed of a single layer or multiple layers.

<Second Layer 230>

As described above, the second layer 330 is a layer including a metal reflective film, and the light reaching the second layer 330 is reflected at this layer.

The metal reflective film included in the second layer 330 may include, for example, silver or a silver alloy. The silver alloy may be an alloy including at least one element selected from a group including silver, gold, palladium, copper, nickel, silicon, aluminum, titanium, and chrome. In this case, the metal content of the silver alloy (other than silver) may range from 0.5% to 5% by mass. Alternatively, the metal reflective film may include aluminum or an aluminum alloy.

In a case where silver or a silver alloy is included in the second layer 130, the reflectance of light in solar light region (300 nm to 2500 nm) can be improved at the second layer 330. Further, the second layer 330 becomes less dependent on the reflectance based on the angle of incidence.

The second layer 330 may have a thickness ranging from, for example, 800 Å to 3000 Å.

<Third Layer 340>

As described above, the third layer 340 has a role of preventing the oxygen in the atmosphere from spreading to the second layer 330 when depositing the fourth layer 350.

The third layer 340 may include an oxide film. In this case, the oxide film may include zinc oxide. Further, in this case, the zinc oxide may be doped with at least one element selected from a group including aluminum, titanium, gallium, and tin.

Alternatively, the third layer 340 may include a metal film. For example, it may include at least one metal selected from a group including zinc, titanium, nickel, chrome, tin, and aluminum.

Zinc is preferable among these metals. In this case, the metal film may include zinc, and may be doped with at least one element selected from a group including aluminum, titanium, gallium, and tin.

Alternatively, the third layer 340 may include a nitride film. For example, the third layer 340 may include at least one nitride film selected from a group including a silicon nitride film, an aluminum nitride film, a chrome nitride film, a nickel nitride film, and a titanium nitride film. In this case, the nitride layer may include oxygen.

The third layer 340 may be formed of a single layer or multiple layers.

The third layer 340 may have a thickness ranging from, for example, 5 Å to 100 Å.

It is to be noted that the third layer 340 is not a requisite member and may be omitted. Particularly, in a case of the embodiment of the mirror apparatus 300, the fourth layer 350 that is formed in a subsequent process includes the silica film having the above-described characteristics. Therefore, even in a case where the third layer 340 is omitted, the second layer 330 can be significantly prevented from being oxidized owing to the oxygen barrier property of the fourth layer 350.

<Fourth Layer 350>

The fourth layer 350 includes a material having a refractive index lower than the fifth layer 360. The fourth layer 350 includes a silica film.

As described above, the silica film has an extinction coefficient "k" less than or equal to $1 \times 10^{-4}$ and a refractive index "n" greater than or equal to 1.466 at a wavelength of 632 nm. Further, the silica film has a carbon content less than or equal to 3 atomic %. Thereby, the fourth layer 350 can exhibit density, which means an oxygen barrier property, and increase the heat resisting property of the mirror apparatus 300 even in a high temperature.

The fourth layer 350 may have a film thickness ranging, for example, from 300 Å to 1500 Å.

<Fifth Layer 360>

The fifth layer 360 includes a material having a higher refractive index than the fourth layer 250. For example, the fifth layer 360 has optical constants such as a refractive index "n" greater than or equal to 1.7 and an extinction coefficient "k" less than or equal to 0.01 at a wavelength of 550 nm.

The material included in the fifth layer 360 is not limited in particular as long as the above-described conditions are satisfied. The fifth layer 360 may include, for example, silicon nitride, aluminum nitride, silicon oxynitride, aluminum oxynitride, niobium oxide, zirconium oxide, tantalum oxide, hafnium oxide, titanium oxide, zinc oxide, and/or tin oxide. Further, the fifth layer 360 may include a complex oxynitride.

Among these materials, silicon nitride is preferable. In a case where silicon nitride is included in the fifth layer 360, the fifth layer 360 exhibits an effect of preventing the oxygen in the atmosphere from entering. Therefore, in this case, the oxygen barrier effects of both the fourth layer 350 and the fifth layer 360 further prevent the oxidization of the second layer.

The fifth layer 360 may have a thickness ranging from 300 Å to 1500 Å. Further, the fifth layer 360 may be formed of a single layer or multiple layers.

The mirror apparatus 300 includes the "basic structure of the reflective member of the present invention" illustrated in FIG. 1. That is, the glass substrate 310, the second layer 330, and the fourth layer 350 of the mirror apparatus 300 correspond to the glass substrate 110, the metal reflective film 120, and the protective film 130 of the reflective member 100 of FIG. 1, respectively.

Hence, an applied example of a protective film according to an embodiment of the present invention has been described above by presenting the low-E glass 200 and the mirror apparatus 300 as examples thereof. It is, however, to be noted that the applied example of the protective film according to an embodiment of the present invention is not limited to the reflective member. That is, one of ordinary skill in the art can expressly understand that the protective film according to an embodiment of the present invention may also be applied to various apparatuses and members or the like that require a heat resisting property.

<Practical Examples>

Next, practical examples of the present invention are described.

<Preliminary Test 1>
<Sample A>

A sample for preliminary test 1 was fabricated by depositing a silica film on a surface of a glass substrate with the following method.

First, a glass substrate was prepared. The glass substrate was a soda-lime glass having a dimension of 100 mm in height×100 mm in width×2 mm in thickness.

A silica film having a thickness of 226 nm (target value) was deposited on one surface of the glass substrate by using a plasma CVD method.

A mixed gas of oxygen and tetramethyldisiloxane (TMDSO) was used as a raw material, in which the flow amount of oxygen is 400 sccm and the flow amount of TMDSO is 50 sccm. Further, the deposition pressure during the plasma CVD process was 0.47 Pa, and the power of the plasma (deposition power density) was 20 kW/m.

By performing the processes above, a preliminary test sample (hereinafter referred to as "sample A") was fabricated.

By performing spectroscopic ellipsometry (manufactured by J.A. Woollam Co., Product name: M-2000DI) on the silica film of the sample A, the refractive index "n" and extinction coefficient "k" in the wavelength region of 632 nm were measured. As the results of the measurement, the refractive index "n" of the silica film was "1.4772, and the extinction coefficient "k" was less than the detection limit of ($1\times10^{-7}$).

Further, the chemical composition of sample A was analyzed by performing depth profiling by using XPS (X-ray Photoelectron Spectroscopy) with an XPS analysis apparatus (manufactured by Ulvac-Phi Inc., Product name: PHI5000). As the results of the analysis, the carbon content of the silica film was less than or equal to the detection limit (value of the detection limit being 0.1 atomic % and hereinafter the same unless described as otherwise).

<Sample B>

A preliminary test sample having a silica film on the surface of a glass substrate (hereinafter referred to as "sample B") was fabricated by using a method similar to the above-described method for sample A).

However, in fabricating sample B, the deposition pressure when depositing the silica film was 3.89 Pa. Other fabrication conditions were similar to those of sample A.

The refractive index "n" and the extinction coefficient "k" of the silica film of the sample B were measured by the above-described method. As the results of the measurement, the refractive index "n" of the silica film was "1.4611, and the extinction coefficient "k" was less than the detection limit of ($1\times10^{-7}$). Further, the carbon content of the silica film was less than or equal to the detection limit.

<Evaluation of Heat Resisting Property>

Heat resistance evaluation tests were performed on samples A and B by using the above-described methods.

The heat resistance evaluation tests were performed as follows.

First, a thermal process was performed on each sample for 17 minutes in an atmosphere of 700° C. Then, after the thermal process, the haze values of the samples were measured to evaluate their heat resisting properties.

In the measurement of the haze rate, a haze rate measuring device (manufactured by Suga Test Instruments Co., Ltd, Hz-2) was used and a double-beam method was performed with a D65 light source.

The term "haze rate" refers to an index that quantitatively indicates the level in which haziness occurs in the sample. With the silica film of the preliminary samples, defects such as cracks appear when the silica films of the samples degrade due to heat. Thus, the haze rate increases as the haziness of the samples increases. Accordingly, by measuring the value of haze, the haze rate can be used as an index for evaluating the heat resisting properties of the preliminary samples.

Table 1 collectively shows the fabrication conditions, the refractive indices "n", the extinction coefficients "k", the carbon content of the samples A and B along with the measurement results of the haze rate obtained by heat resistance evaluation test.

TABLE 1

| SAMPLE | DEPOSITION METHOD OF SILICA FILM | DEPOSITION PRESSURE (Pa) | DEPOSITION POWER DENSITY (kW/m) | REFRACTIVE INDEX OF SILICA FILM n | EXTINCTION COEFFICIENT OF SILICA FILM k | C CONTENT OF SILICA FILM (%) | HAZE RATE AFTER THERMAL PROCESS (%) |
|---|---|---|---|---|---|---|---|
| A | PLASMA CVD METHOD | 0.47 | 20 | 1.4772 | LESS THAN $1 \times 10^{-7}$ | N.D. | 0.12 |
| B | PLASMA CVD METHOD | 3.89 | 20 | 1.4611 | LESS THAN $1 \times 10^{-7}$ | N.D. | 1.53 |

According to the results of Table 1, it can be understood that the haze rate after the thermal process is restrained by comparing sample A with sample B.

Sample A shows that the refractive index "n" of the silica film is "1.4772, the extinction coefficient "k" is less than $(1\times10^{-7})$, and the carbon content of the silica film is less than or equal to the detection limit. On the other hand, sample B shows that the refractive index "n" of the silica film is "1.4611, the extinction coefficient "k" is less than $(1\times10^{-7})$, and the carbon content of the silica film is less than or equal to the detection limit. Compared to sample B, the silica film of sample A has a higher refractive index "n". Thus, it can be understood that the high refractive index contributes to the restraining of the haze after the thermal process.

With sample A including a silica film having a refractive index "n" greater than or equal to 1.467 and an extinction coefficient "k" less than or equal to $1\times10^{-7}$ at a wavelength of 632 nm, and a carbon content less than or equal to the detection limit, a satisfactory heat resisting property can be attained compared to sample B including a silica film having a refractive index "n" to a degree of 1.46.

Further, according to Table 1, the film deposition pressure is to be less than or equal to 2 Pa for depositing a silica film having a satisfactory heat resisting property. By setting the film deposition pressure in this manner, the reactivity of TMDSO that is the source gas in the plasma can be increased, and the amount of impurity such as carbon originating from the source gas in the silica film can be reduced.

<Preliminary Test 2>
<Sample 1>

A sample of a protective film for the preliminary test 2 was fabricated by depositing a first silica film, a titanium metal film, and a second silica film in this order on the surface of a glass substrate with the following method.

First, a glass substrate was prepared. The glass substrate is a soda-lime glass having a dimension of 100 mm in height×100 mm in width×2 mm in thickness.

The first silica film having a thickness of 50 nm (target value) was deposited on one surface of the glass substrate by using a plasma CVD method.

The deposition conditions of the first silica film were the same as the conditions for depositing the silica film of the above-described sample A of preliminary test 1. Therefore, the silica film has a refractive index "n" of 1.4772 and an extinction coefficient "k" of less than $1\times10^{-7}$ at a wavelength of 632 nm, and a carbon content less than or equal to the detection limit.

Then, the titanium metal film was deposited on the first silica film by using a regular sputtering method. The thickness of the titanium metal film was made to be 10 nm (target value).

A titanium metal target was used as a target, and argon gas was used as a deposition gas. The deposition was performed by applying power of 0.5 kW from a DC current source at a sputtering pressure of 0.35 Pa.

Then, the second silica film was deposited on the titanium metal film by using a plasma CVD method. The deposition conditions of the second silica film were substantially the same as the deposition conditions of the first silica film.

By performing the above-described processes, a sample of a protective film for the preliminary test 2 was fabricated.

<Sample 2>

By performing a method similar to that of the above-described sample 1, a sample for a preliminary test 2 having a first silica film, a titanium metal film, and a second silica film on the surface of a glass substrate (hereinafter referred to as "sample 2") was fabricated.

However, in fabricating sample 2, the deposition pressure was 0.56 Pa when depositing the first and second silica films. The fabrication conditions except these conditions were similar to those of sample 1.

The refractive index "n" and the extinction coefficient "k" of the second silica film of sample 2 were measured with the above-described method. As a result of the measurement, the refractive index "n" was 1.4773 and an extinction coefficient "k" was less than $1\times10^{-7}$ at a wavelength of 632 nm, and a carbon content was less than or equal to the detection limit.

<Sample 3>

By performing a method similar to that of the above-described sample 1, a sample for a preliminary test 2 having a first silica film, a titanium metal film, and a second silica film on the surface of a glass substrate (hereinafter referred to as "sample 3") was fabricated.

However, in fabricating sample 3, the flow amount of oxygen is 236 sccm and the flow amount of TMDSO was 15 sccm when depositing the first and second silica films. Further, the deposition pressure during the plasma CVD process was 0.35 Pa, and the plasma power (deposition power density) was 80 kW/m.

The refractive index "n" and the extinction coefficient "k" of the second silica film of sample 3 were measured with the above-described method. As a result of the measurement, the refractive index "n" was 1.469 and an extinction coefficient "k" was less than $1\times10^{-7}$ at a wavelength of 632 nm. Further the carbon content of the second silica film was less than or equal to the detection limit.

<Sample 4>

By performing a method similar to that of the above-described sample 1, a sample for a preliminary test 2 having a first silica film, a titanium metal film, and a second silica film on the surface of a glass substrate (hereinafter referred to as "sample 4") was fabricated.

The deposition conditions of the first and second silica films were the same as the conditions for depositing the silica film of the above-described sample B of preliminary test 1. Therefore, the silica films have a refractive index "n" of 1.4611 and an extinction coefficient "k" less than $1\times10^{-7}$, and a carbon content less than or equal to the detection limit.

<Sample 5>

A first silica film was deposited on the surface of the glass surface used for the sample 1 by using a conventional sputtering method. The sputtering pressure during the deposition was 0.27 Pa. The thickness of the first silica film was 50 nm (target value).

A silicon oxide film was deposited by using a metal silicon target (boron-doped polycrystalline target, silicon content of 99.999% by mass) as a target and performing a pulse DC reactive sputtering method thereon. An oxygen gas (flow rate of 30 sccm) and an argon gas (flow rate of 20 sccm) were used as the sputtering gas. A power of 1.5 kW was supplied, and the frequency was 20 kHz.

Then, a titanium metal film was deposited on the first silica film by using a regular sputtering method. The thickness of the titanium metal film was 10 nm (target value). The deposition conditions of the titanium metal film were similar to those of sample 1.

Then, a second silica film was deposited on the titanium metal film by using a sputtering method. The deposition conditions of the second silica film were substantially the same as the deposition conditions of the first silica film.

By performing the above-described processes, a sample for the preliminary test 2 was fabricated (hereinafter referred to as "sample 5").

The refractive index "n" and the extinction coefficient "k" of the second silica film of sample 5 were measured by the above-described method. As a result of the measurement, the refractive index "n" was 1.4602 and an extinction coefficient "k" was less than $1 \times 10^{-7}$ at a wavelength of 632 nm. Further the carbon content of the second silica film was less than or equal to the detection limit.

Table 2 collectively shows the fabrication conditions, the refractive indices "n", the extinction coefficients "k", and the carbon content of the samples 1 to 5.

reaches the titanium film. This causes oxidization of the titanium film and increases the transparency of the titanium film. As a result, the "transmittance of visible light after thermal process $Tv_a$" increases. However, in a case where the second silica film has a comparatively satisfactory oxygen barrier property, the oxygen in the atmosphere is significantly prevented from reaching the titanium film. As a result, oxidization of the titanium film is prevented, and the "transmittance of visible light after thermal process $Tv_a$" is significantly prevented from increasing.

Therefore, the heat resisting properties of the samples can be evaluated by evaluating the change amount Δ Tv of the visible light transmittance Tv before and after the thermal

TABLE 2

| SAMPLE | DEPOSITION METHOD OF $1^{ST}$ AND $2^{ND}$ SILICA FILMS | DEPOSITION PRESSURE (Pa) | DEPOSITION POWER DENSITY (kW/m) | REFRACTIVE INDEX OF $2^{ND}$ SILICA FILM n | EXTINCTION COEFFICIENT OF $2^{ND}$ SILICA FILM k | C CONTENT OF $2^{ND}$ SILICA FILM (%) | ΔTv (%) |
|---|---|---|---|---|---|---|---|
| 1 | PLASMA CVD METHOD | 0.47 | 20 | 1.4772 | LESS THAN $1 \times 10^{-7}$ | N.D. | 22.3 |
| 2 | PLASMA CVD METHOD | 0.56 | 20 | 1.4773 | LESS THAN $1 \times 10^{-7}$ | N.D. | 20.84 |
| 3 | PLASMA CVD METHOD | 0.35 | 80 | 1.469 | LESS THAN $1 \times 10^{-7}$ | N.D. | 14.69 |
| 4 | PLASMA CVD METHOD | 3.89 | 20 | 1.4611 | LESS THAN $1 \times 10^{-7}$ | N.D. | 29.71 |
| 5 | SPUTTER METHOD | 0.27 | — | 1.4602 | LESS THAN $1 \times 10^{-7}$ | N.D. | 34.35 |

<Evaluation of Heat Resisting Property>

A heat resisting property evaluation test was performed on the samples 1 to 5 that are fabricated by the above-described methods.

The heat resisting property evaluation test was performed as follows.

First, the visible light transmittance Tv of each sample was measured by using a spectrophotometer (manufactured by Hitachi Ltd., U4100). The visible light transmittance Tv was obtained by multiplying the spectral transmittance in a wavelength of 380 nm to 780 nm with a weighted coefficient obtained from a spectral of CIE daylight and a wavelength distribution of luminosity factor and obtaining the average. The value of the obtained visible light transmittance Tv is assumed as an "initial visible light transmittance $Tv_o$".

Then, a thermal process is performed on each sample for 35 minutes in an air atmosphere of 400° C. After performing the thermal process, the visible light transmittance of each sample is measured and assumed as the "transmittance of visible light after thermal process $Tv_a$". The change amount Δ Tv of the visible light transmittance Tv before and after the thermal process is obtained from the difference between the obtained "transmittance of visible light after thermal process $Tv_a$" and the "initial visible light transmittance $Tv_o$" ($\Delta Tv = Tv_a - Tv_o$).

The initial sample has a titanium metal film interposed between silica films. Therefore, the "initial visible light transmittance $Tv_o$" of each of the samples is comparatively low.

On the other hand, the samples after the thermal process show that the "transmittance of visible light after thermal process $Tv_a$" largely changes particularly due to the difference of the oxygen barrier property of the second silica film. For example, in a case where the second silica film does not have a satisfactory oxygen barrier property, the oxygen in the atmosphere passes through the second silica film and process. More specifically, the heat resisting property is more satisfactory, the less the change amount Δ Tv.

Figure 5:
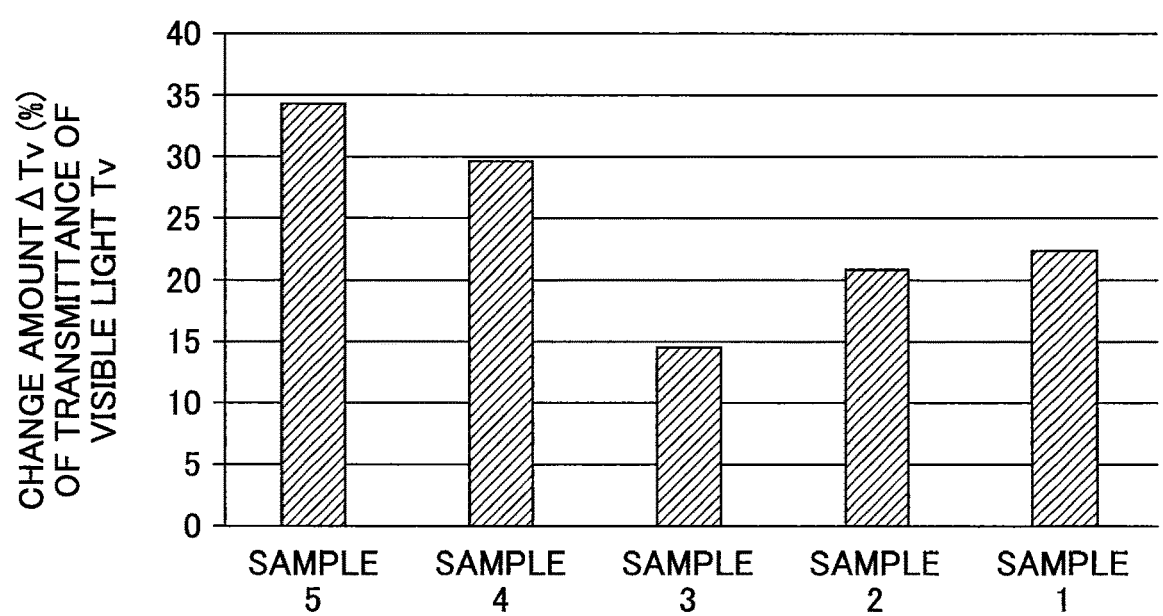
FIG. 5 is a graph illustrating a change amount Δ Tv (%) of a transmittance of visible light of each sample before and after performing a thermal process in a preliminary test.

FIG. 5 collectively shows the results obtained by the heat resisting property evaluation test. Further, the change amount ΔTv of the visible light transmittance Tv obtained from each sample is shown in the above-described Table 2.

According to these results, samples 1 to 3 show that the change amount Δ Tv of the visible light transmittance Tv is significantly restrained compared to samples 4 and 5. That is, the change amount of samples 1 to 3 is less than or equal to approximately 25% whereas the change amount of samples 4 and 5 is greater than or equal to approximately 30%. Because the oxygen barrier property of the silica film of samples 4 and 5 is unsatisfactory, the oxygen in the atmosphere reaches the titanium film and causes the titanium to oxidize during the thermal process.

The samples 1 to 3 show that the silica film has a refractive index "n" of 1.4772, 1.4773, and 1.469, respectively. On the other hand, the samples 4 and 5 show that the silica film has a refractive index "n" of 1.4611 and 1.4602, respectively. Therefore, the difference of the change amount ΔTv of the visible light transmittance Tv is due to the refractive index "n" of the silica film. The oxygen barrier property of the silica film improves and the heat resisting property of the sample improves when the refractive index "n" exceeds 1.4611. Particularly, the sample is estimated to have a satisfactory heat resisting property when the refractive index "n" of the silica film is greater than or equal to 1.467.

It can be understood that the amount of carbon in the silica film for each of the samples is less than or equal to the detection limit, and that there is a positive relationship between the refractive index "n" and density.

<Heat Resisting Property Test of Low-E Glass Sample>

The results of the above-described preliminary tests show that the silica film exhibits a satisfactory oxygen barrier property when the refractive index "n" of the silica film exceeds 1.467. Next, a low-E glass sample having an actual low-E glass configuration was fabricated and subjected to evaluation of its heat resisting property.

<Low-E Glass Sample 1>

A low-E glass sample (low-E glass sample 1) was fabricated as follows.

First, a glass substrate was prepared. The glass substrate is a soda-lime glass having a dimension of 100 mm in height×100 mm in width×3 mm in thickness.

A first layer (target thickness 30 nm), a second layer (target thickness 8.5 nm), a third layer (target thickness 3 nm), a fourth layer (target thickness 26 nm), and a fifth layer (target thickness 24 nm) were sequentially deposited on one surface of the glass substrate. Thereby, the low-E glass sample 1 having a layer configuration illustrated in FIG. 4 was fabricated.

The first layer includes an aluminum doped zinc oxide. The second layer includes a silver alloy having a gold content of 1% by mass. The third layer includes an aluminum doped zinc. The fourth layer includes silica. The fifth layer includes silicon nitride.

Among these layers, the first to third layers, and the fifth layer were deposited by the following sputtering method.

First, an aluminum doped zinc oxide film was deposited on the glass substrate by using a zinc target doped with aluminum of 5 atomic % and performing a DC reactive sputtering method thereon. An argon gas (flow rate of 60 sccm) and an oxygen gas (flow rate of 140 sccm) were used as the sputtering gas. A power of 0.5 kW was supplied.

Then, after exhausting the remaining gas, a silver alloy film was deposited on the glass substrate formed with the aluminum doped zinc oxide film by using a silver alloy target containing gold of 1% by mass and performing a DC sputtering method thereon. An argon gas (flow rate of 200 sccm) was used as the sputtering gas. A power of 0.9 kW was supplied.

Then, an aluminum doped zinc film was deposited on the silver alloy film by using a zinc target doped with aluminum of 5 atomic % and performing a DC sputtering method thereon. An argon gas (flow rate 200 sccm) was used as the sputtering gas. A power of 0.05 kW was supplied.

Then, the fourth layer made of silica was deposited by performing a plasma CVD method. The conditions for performing the plasma CVD method were the same conditions used when depositing the first silica film in the above-described sample 3 of the preliminary test. Therefore, the fourth layer has a refractive index "n" of 1.469 and extinction coefficient "k" less than $1×10^{-7}$ at a wavelength of 632 nm, and a carbon content less than or equal to the detection limit.

Then, after exhausting the remaining gas, a silicon nitride film was deposited by using a metal silicon target (boron doped polycrystalline target, silicon content of 99.999% by mass) and performing a pulse DC reactive sputtering method thereon. A nitrogen gas (flow rate of 60 sccm) and an argon gas (flow rate of 14 sccm) were used as the sputtering gas. A power of 1 kW was supplied, and the frequency was 20 kHz.

<Low-E Glass Sample 2>

A low-E glass sample (low-E glass sample 2) having a similar layer configuration as the low-E glass sample 1 was fabricated. However, the third layer (aluminum doped zinc film) of the low-E glass sample 2 had a thickness of 4.5 nm.

The other deposition conditions were the same as the low-E glass sample 1.

<Low-E Glass Sample 3>

A low-E glass sample (low-E glass sample 3) having a similar layer configuration as the low-E glass sample 1 was fabricated. However, the third layer (aluminum doped zinc film) of the low-E glass sample 2 had a thickness of 6 nm.

The other deposition conditions were the same as the low-E glass sample 1.

<Low-E Glass Sample 4>

A low-E glass sample (low-E glass sample 4) having a similar layer configuration as the low-E glass sample 1 was fabricated. However, the fourth layer of the low-E glass sample 4 was deposited by a sputtering method. The sputtering conditions were the same as the conditions used when depositing the first silica film of the above-described sample 5 of the preliminary test. Therefore, the fourth layer has a refractive index "n" of 1.4602 and an extinction coefficient "k" less than $1×10^{-7}$ at a wavelength of 632 nm, and a carbon content less than or equal to the detection limit.

The other deposition conditions were the same as the low-E glass sample 1.

<Low-E Glass Sample 5>

A low-E glass sample (low-E glass sample 5) having a similar layer configuration as the low-E glass sample 4 was fabricated. However, the third layer (aluminum doped zinc film) of the low-E glass sample 5 had a thickness of 4.5 nm.

The other deposition conditions were the same as the low-E glass sample 1.

<Low-E Glass Sample 6>

A low-E glass sample (low-E glass sample 6) having a similar layer configuration as the low-E glass sample 4 was fabricated. However, the third layer (aluminum doped zinc film) of the low-E glass sample 6 had a thickness of 6 nm.

The other deposition conditions were the same the low-E glass sample 4.

Table 3 collectively shows the fabrication conditions of the fourth layer of the low-E glass samples 1 to 6 along with their refractive indices "n", extinction coefficients "k", and carbon content.

TABLE 3

| LOW-E GLASS SAMPLE | THICKNESS OF 3$^{RD}$ LAYER (nm) | DEPOSITION METHOD OF 4$^{TH}$ LAYER | DEPOSITION PRESSURE (Pa) | DEPOSITION POWER DENSITY (kW/m) | REFRACTIVE INDEX OF 4$^{TH}$ LAYER n | EXTINCTION COEFFICIENT OF 4$^{TH}$ LAYER k | C CONTENT OF 4$^{TH}$ LAYER (%) |
|---|---|---|---|---|---|---|---|
| 1 | 3 | PLASMA CVD METHOD | 0.35 | 80 | 1.469 | LESS THAN $1 × 10^{-7}$ | N.D. |
| 2 | 4.5 | PLASMA CVD METHOD | 0.35 | 80 | 1.469 | LESS THAN $1 × 10^{-7}$ | N.D. |

TABLE 3-continued

| | | | | | | | |
|---|---|---|---|---|---|---|---|
| 3 | 6 | PLASMA CVD METHOD | 0.35 | 80 | 1.469 | LESS THAN $1 \times 10^{-7}$ | N.D. |
| 4 | 3 | SPUTTER METHOD | 0.27 | — | 1.4602 | LESS THAN $1 \times 10^{-7}$ | N.D. |
| 5 | 4.5 | SPUTTER METHOD | 0.27 | — | 1.4602 | LESS THAN $1 \times 10^{-7}$ | N.D. |
| 6 | 6 | SPUTTER METHOD | 0.27 | — | 1.4602 | LESS THAN $1 \times 10^{-7}$ | N.D. |

| LOW-E GLASS SAMPLE | SHEET RESISTANCE AFTER THERMAL PROCESS Rs ($\Omega/\square$) | TRANSMITTANCE OF VISIBLE LIGHT AFTER THERMAL PROCESS Tv (%) | $\Delta$Tv (%) | EMISSIVITY RATE AFTER THERMAL PROCESS $\varepsilon$ (%) | HAZE RATE AFTER THERMAL PROCESS (%) |
|---|---|---|---|---|---|
| 1 | 5.85 | 82.7 | 7.9 | 0.1 | 0.47 |
| 2 | 5.71 | 82.9 | 10 | 0.1 | 0.57 |
| 3 | 7.83 | 75.8 | 12.4 | 0.12 | 0.53 |
| 4 | 5.63 | 88.3 | 12.4 | 0.16 | 0.78 |
| 5 | 7.42 | 86 | 16 | 0.2 | 1.2 |
| 6 | 12.2 | 79.2 | 22.8 | 0.18 | 1.38 |

<Heat Resisting Property Test>

Heat resisting property tests were performed on the low-E glass samples 1 to 6. The heat resisting property test was conducted by performing a thermal process on each low-E glass sample for 3 minutes in an atmosphere of 730° C.

The sheet resistance, the emissivity, and the haze rate of each of the low-E glass samples were measured after performing the thermal process on each of the low-E glass samples.

In measuring the sheet resistance, a sheet resistance measuring device (manufactured by Delcom Instruments Inc., 717B Conductance monitor) was used. The sheet resistance Rs ($\Omega$/square) of the low-E glass sample increases as the second layer (and the third layer) oxidizes. Therefore, the value of the sheet resistance Rs can be used as an index for evaluating the protective property of the fourth layer.

Further, in measuring the emissivity, an emissivity measuring device (manufactured by Japan Sensor Inc., TSS-5X) was used to obtain the emissivity $\varepsilon$ (%) in the wavelength region of 2 μm to 22 μm. The emissivity $\varepsilon$ of the low-E glass sample increases as the second layer (and the third layer) oxidizes. Therefore, the value of the emissivity $\varepsilon$ can be used as an index for evaluating the protective property of the fourth layer.

Further, in measuring the haze rate, a haze rate measuring device (manufactured by Suga Test Instruments Co., Ltd, Hz-2) was used and a double-beam method was performed with a D65 light source. The term "haze rate" refers to an index that quantitatively indicates the level in which haziness occurs in the sample. When the second layer of the low-E glass sample is degraded by heat, the second layer tends to cohere. Therefore, the haze rate can be used as an index for evaluating the protective property of the fourth layer.

Further, the visible light transmittance Tv of each sample is measured by using a spectrophotometer (manufactured by Hitachi Ltd., U4100) with a similar method as the above-described preliminary test 2 to obtain the change amount $\Delta$Tv of the visible light transmittance Tv of the samples before and after performing the thermal process. The $\Delta$Tv of the low-E glass samples increases as the second layer (and the third layer) oxidizes. Therefore, the $\Delta$Tv can be used as an index for evaluating the protective property of the silica film.

Figure 6:
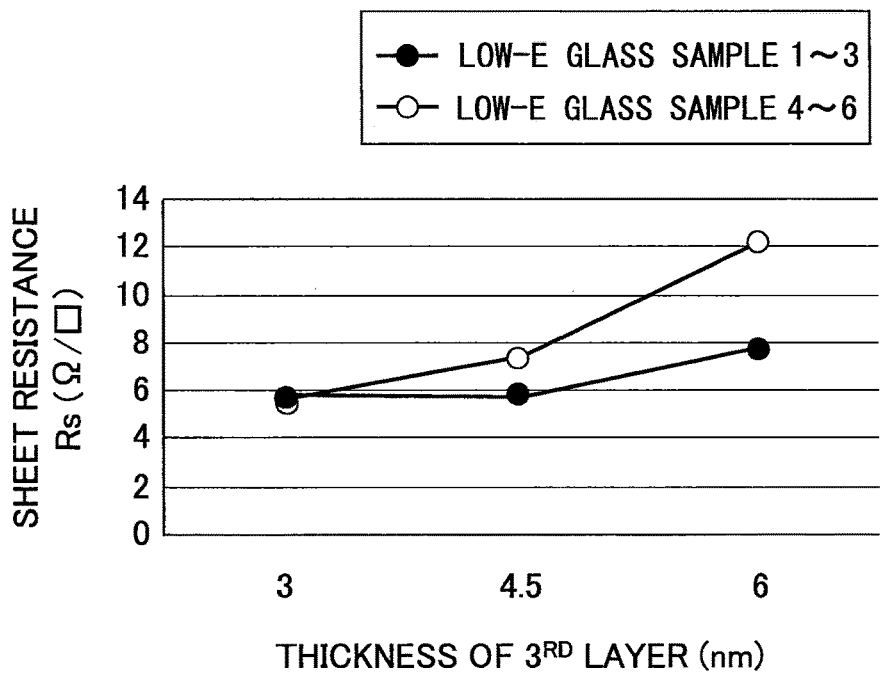
FIG. 6 is a graph illustrating the results of measuring a sheet resistance of each sample of a low-E glass after heating.

The results of measuring the sheet resistance after performing the thermal process on each of the low-E glass samples are shown in FIG. 6. In FIG. 6, the horizontal axis indicates the thickness of the third layer, and the vertical axis indicates the sheet resistance Rs ($\Omega$/square).

According to the results shown in FIG. 6, it can be understood that sheet resistance Rs ($\Omega$/square) after performing the thermal process on the low-E glass samples 1 to 3 can be significantly restrained compared to those of the low-E glass samples 4 to 6.

Figure 7:
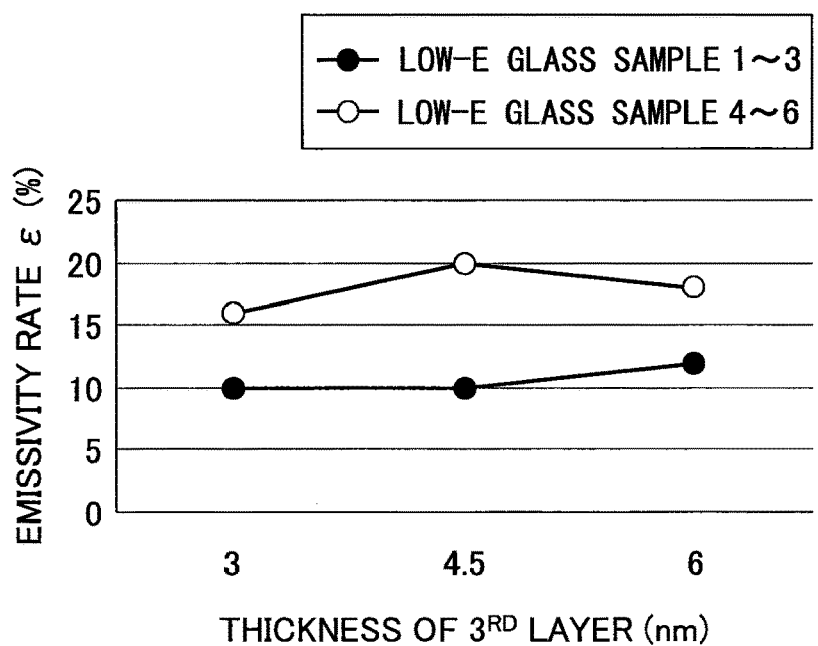
FIG. 7 is a graph illustrating the results of measuring an emissivity rate of each sample of a low-E glass after heating.

The results of measuring the emissivity after performing the thermal process on each of the low-E glass samples are shown in FIG. 7. In FIG. 7, the horizontal axis indicates the thickness of the third layer, and the vertical axis indicates the emissivity $\varepsilon$ (%).

According to the results shown in FIG. 7, it can be understood that emissivity $\varepsilon$ (%) after performing the thermal process on the low-E glass samples 1 to 3 can be significantly restrained compared to those of the low-E glass samples 4 to 6.

According to these results, it is confirmed that the fourth layer of the low-E glass samples 1 to 3 including the silica film exhibit a satisfactory oxygen barrier property.

Figure 8:
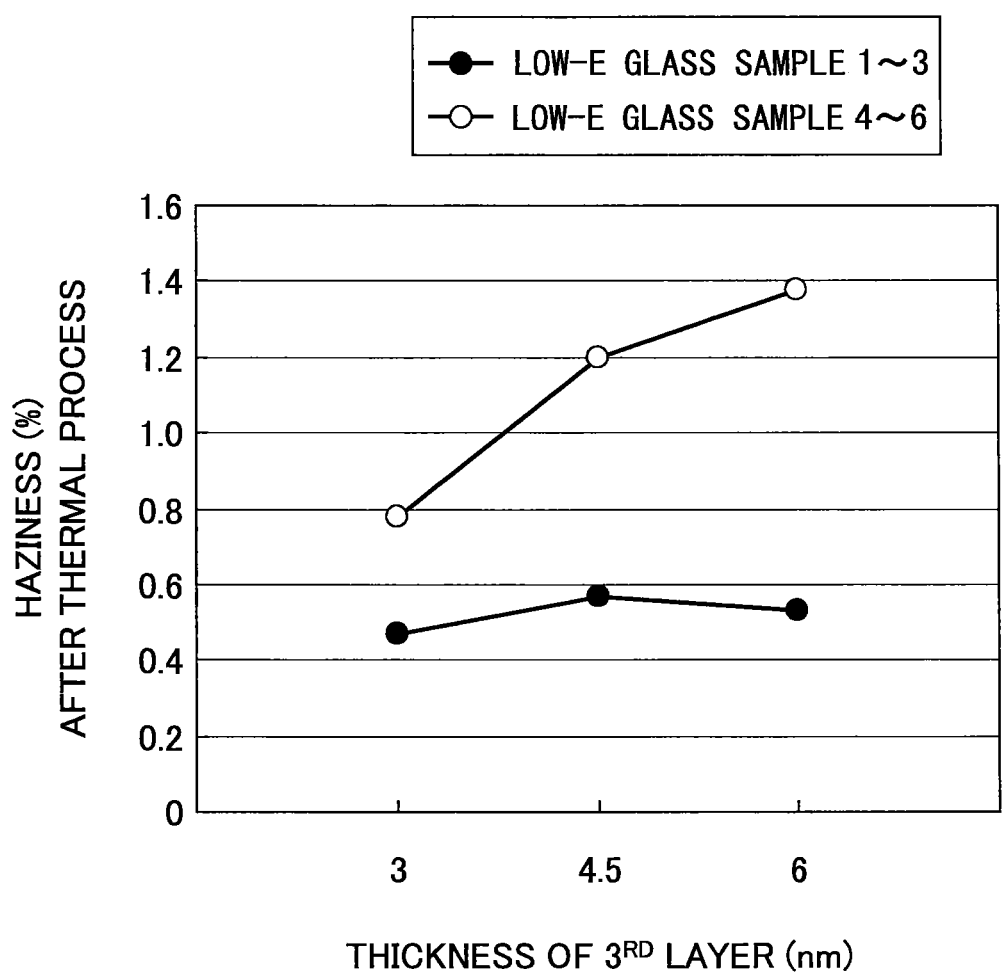
FIG. 8 is a graph illustrating the results of measuring a haze of each sample of a low-E glass after heating.

The results of measuring the haze rate after performing the thermal process on each of the low-E glass samples are shown in FIG. 8. In FIG. 8, the horizontal axis indicates the thickness of the third layer, and the vertical axis indicates the haze rate (%).

According to the results shown in FIG. 8, it can be understood that haze rate after performing the thermal process on the low-E glass samples 1 to 3 can be significantly restrained compared to those of the low-E glass samples 4 to 6.

The results show that the second layer of the low-E glass samples 1 to 3 tend to exhibit less cohesiveness. That is, the second layer is not significantly degraded by the thermal process. Therefore, it can be understood that degradation by heat of the low-E glass samples 1 to 3 is restrained compared to those of the low-E glass samples 4 to 6.

The results of measuring the change amount ΔTv of the visible light transmittance Tv before and after performing the thermal process on each low-E glass sample are shown in Table 3. According to the results shown in Table 3, it can be understood that the change amount ΔTv of the transmittance before and after performing the thermal process on the low-E glass samples 1 to 3 can be significantly restrained compared to those of the low-E glass samples 4 to 6.

With the low-E glass samples 1 to 3 having a fourth layer including a silica film having a refractive index "n" greater than or equal to 1.467 and an extinction coefficient "k" less than or equal to $1 \times 10^{-4}$ at a wavelength of 632 nm, and a carbon content less than or equal to 3 atomic %, a satisfactory oxygen barrier property can be attained compared to the low-E glass samples 4 to 6 having a fourth layer including a silica film having a refractive index "n" to a degree of 1.46.

The results of the heat resisting property tests obtained from the low-E glass samples 1 to 6 are collectively shown in the above-described Table 3.

<Low-E Glass Sample 7>

A low-E glass sample (low-E glass sample 7) was fabricated as follows.

First, a glass substrate was prepared. The glass substrate is a soda-lime glass having a dimension of 100 mm in height×100 mm in width×3 mm in thickness.

A first layer (target thickness 30 nm), a second layer (target thickness 10 nm), a third layer (target thickness 10 nm), a fourth layer (target thickness 2 nm), and a fifth layer (target thickness 50 nm) were sequentially deposited on one surface of the glass substrate. Thereby, the low-E glass sample 7 having a layer configuration illustrated in FIG. 4 was fabricated.

The first layer includes a tin zinc oxide film. The second layer includes an aluminum doped zinc oxide. The third layer includes silver. The fourth layer includes titanium. The fifth layer includes silica.

Among these layers, the first to fourth layers were deposited by the following sputtering method.

First, a tin zinc oxide film was deposited on the glass substrate by using an alloy target including zinc of 33 atomic % and tin of 67 atomic % and performing a DC reactive sputtering method thereon. An argon gas (flow rate of 120 sccm) and an oxygen gas (flow rate of 280 sccm) were used as the sputtering gas. A power of 1 kW was supplied, and the frequency was 20 kHz.

Then, an aluminum doped zinc oxide film was deposited on the tin zinc oxide film by using a zinc target doped with aluminum of 5 atomic % and performing a DC reactive sputtering method thereon. An argon gas (flow rate of 120 sccm) and an oxygen gas (flow rate of 280 sccm) were used as the sputtering gas. A power of 1 kW was supplied.

Then, after exhausting the remaining gas, a silver film was deposited on the aluminum doped zinc oxide film by using a silver target and performing a DC sputtering method thereon. An argon gas (flow rate of 400 sccm) was used as the sputtering gas. A power of 0.7 kW was supplied.

Then, a titanium metal film was deposited on the silver film by using a titanium metal target and performing a DC sputtering method thereon. An argon gas (flow rate of 400 sccm) was used as the sputtering gas. A power of 0.5 kW was supplied.

Then, the fifth layer made of silica was deposited by performing a plasma CVD method. As for the conditions for performing the plasma CVD method, a mixed gas of oxygen and tetramethyldisiloxane (TMDSO) was used as a raw material, in which the flow amount of oxygen was 250 scan and the flow amount of TMDSO is 15 sccm. Further, the deposition pressure during the plasma CVD process was 0.23 Pa, and the deposition power density was 80 kW/m.

The refractive index "n" and the extinction coefficient "k" of the silica film of the fifth layer were measured by the above-described method. The results of the measurement show that the silica film of the fifth layer has a refractive index "n" of 1.4736 and extinction coefficient "k" less than $1=10^{-7}$ at a wavelength of 632 nm, and a carbon content that is less than or equal to the detection limit.

<Low-E Glass Sample 8>

A low-E glass sample (low-E glass sample 8) having a similar layer configuration as the low-E glass sample 7 was fabricated. However, the fourth layer (titanium metal film) of the low-E glass sample 8 had a thickness of 6 nm.

The other deposition conditions were the same the low-E glass sample 7.

<Low-E Glass Sample 9>

A low-E glass sample (low-E glass sample 9) having a similar layer configuration as the low-E glass sample 7 was fabricated. However, the deposition pressure when depositing the fifth layer (silica film) of the low-E glass sample 9 was 0.51 Pa.

The refractive index "n" and the extinction coefficient "k" of the silica film of the fifth layer (silica film) of the low-E glass sample 9 were measured by the above-described method. The results of the measurement show that the silica film of the fifth layer has a refractive index "n" of 1.4694 and extinction coefficient "k" less than $1 \times 10^{-7}$ at a wavelength of 632 nm, and a carbon content less than or equal to the detection limit.

The other deposition conditions were the same as the low-E glass sample 7.

<Low-E Glass Sample 10>

A low-E glass sample (low-E glass sample 10) having a similar layer configuration as the low-E glass sample 9 was fabricated. However, the fourth layer (titanium metal film) of the low-E glass sample 10 had a thickness of 6 nm.

The other deposition conditions were the same as the low-E glass sample 9.

<Low-E Glass Sample 11>

A low-E glass sample (low-E glass sample 11) was fabricated as follows.

First, a glass substrate was prepared. The glass substrate is a soda-lime glass having a dimension of 100 mm in height×100 mm in width×3 mm in thickness.

A first layer (target thickness 30 nm), a second layer (target thickness 10 nm), a third layer (target thickness 10 nm), a fourth layer (target thickness 2 nm), a fifth layer (target thickness 20 nm), a sixth layer (target thickness 10 nm), and a seventh layer (target thickness 5 nm) were sequentially deposited on one surface of the glass substrate. Thereby, the low-E glass sample 11 having a layer configuration illustrated in FIG. 4 was fabricated.

The first layer includes a tin zinc oxide film. The second layer includes an aluminum doped zinc oxide. The third layer includes silver. The fourth layer includes titanium. The fifth layer includes silica. The sixth layer includes a tin zinc oxide film. The seventh layer includes silicon nitride.

Among these layers, the first to fourth layers, the sixth layer, and the seventh layers were deposited by the following sputtering method.

First, a tin zinc oxide film was deposited on the glass substrate by using an alloy target including zinc of 33 atomic % and tin of 67 atomic % and performing a DC pulse reactive sputtering method thereon. An argon gas (flow rate of 120 sccm) and an oxygen gas (flow rate of 280 scam)

were used as the sputtering gas. A power of 1 kW was supplied, and the frequency was 20 kHz.

Then, an aluminum doped zinc oxide film was deposited on the tin zinc oxide film by using a zinc target doped with aluminum of 5 atomic % and performing a DC reactive sputtering method thereon. An argon gas (flow rate of 120 sccm) and an oxygen gas (flow rate of 280 sccm) were used as the sputtering gas. A power of 1 kW was supplied.

Then, after exhausting the remaining gas, a silver film was deposited on the aluminum doped zinc oxide film by using a silver target and performing a DC sputtering method thereon. An argon gas (flow rate of 400 sccm) was used as the sputtering gas. A power of 0.7 kW was supplied.

Then, a titanium metal film was deposited on the silver film by using a titanium metal target and performing a DC sputtering method thereon. An argon gas (flow rate of 400 sccm) was used as the sputtering gas. A power of 0.5 kW was supplied.

Then, after exhausting the remaining gas, the fifth layer made of silica was deposited by performing a plasma CVD method. As for the conditions for performing the plasma CVD method, a mixed gas of oxygen and tetramethyldisiloxane (TMDSO) was used as a raw material, in which the flow amount of oxygen is 250 sccm and the flow amount of TMDSO is 15 scam. Further, the deposition pressure during the plasma CVD process was 0.23 Pa, and the deposition power density was 80 kW/m.

The refractive index "n" and the extinction coefficient "k" of the silica film of the fifth layer were measured by the above-described method. The results of the measurement show that the silica film of the fifth layer has a refractive index "n" of 1.4736 and extinction coefficient "k" less than $1\times10^{-7}$ at a wavelength of 632 nm, and a carbon content that is less than or equal to the detection limit.

Then, after exhausting the remaining gas, a tin zinc oxide film was deposited on the glass substrate by using an alloy target including zinc of 33 atomic % and tin of 67 atomic % and performing a DC pulse reactive sputtering method thereon. An argon gas (flow rate of 120 sccm) and an oxygen gas (flow rate of 280 scam) were used as the sputtering gas. A power of 1 kW was supplied, and the frequency was 20 kHz.

Then, after exhausting the remaining gas, a silicon nitride film was deposited by using a metal silicon target (boron-doped polycrystalline target, silicon content of 99.999% by mass) as a target and performing a pulse DC reactive sputtering method thereon. A nitrogen gas (flow rate of 120 scam) and an argon gas (flow rate of 280 sccm) were used as the sputtering gas. A power of 1 kW was supplied, and the frequency was 20 kHz.

<Low-E Glass Sample 12>

A low-E glass sample (low-E glass sample 12) having a similar layer configuration as the low-E glass sample 11 was fabricated. However, the fourth layer (titanium metal film) of the low-E glass sample 12 had a thickness of 6 nm.

The other deposition conditions were the same as the low-E glass sample 11.

Table 4 collectively shows the fabrication conditions of the fifth layer of the low-E glass samples 7 to 12 along with their refractive indices "n", extinction coefficients "k", and carbon content.

TABLE 4

| LOW-E GLASS SAMPLE | THICKNESS OF $4^{TH}$ LAYER (nm) | DEPOSITION METHOD OF $5^{TH}$ LAYER | DEPOSITION PRESSURE (Pa) | DEPOSITION POWER DENSITY (kW/m) | REFRACTIVE INDEX OF $5^{TH}$ LAYER n | EXTINCTION COEFFICIENT OF $5^{TH}$ LAYER k | C CONTENT OF $5^{TH}$ LAYER (%) |
|---|---|---|---|---|---|---|---|
| 7 | 2 | PLASMA CVD METHOD | 0.23 | 80 | 1.4736 | LESS THAN $1 \times 10^{-7}$ | N.D. |
| 8 | 6 | PLASMA CVD METHOD | 0.23 | 80 | 1.4736 | LESS THAN $1 \times 10^{-7}$ | N.D. |
| 9 | 2 | PLASMA CVD METHOD | 0.51 | 80 | 1.4694 | LESS THAN $1 \times 10^{-7}$ | N.D. |
| 10 | 6 | PLASMA CVD METHOD | 0.51 | 80 | 1.4694 | LESS THAN $1 \times 10^{-7}$ | N.D. |
| 11* | 2 | PLASMA CVD METHOD | 0.23 | 80 | 1.4736 | LESS THAN $1 \times 10^{-7}$ | N.D. |
| 12* | 6 | PLASMA CVD METHOD | 0.23 | 80 | 1.4736 | LESS THAN $1 \times 10^{-7}$ | N.D. |

| LOW-E GLASS SAMPLE | SHEET RESISTANCE AFTER THERMAL PROCESS Rs (Ω/□) | TRANSMITTANCE OF VISIBLE LIGHT AFTER THERMAL PROCESS Tv (%) | ΔTv (%) | EMISSIVITY RATE AFTER THERMAL PROCESS ε (%) | HAZE RATE AFTER THERMAL PROCESS (%) |
|---|---|---|---|---|---|
| 7 | 4.55 | 84.7 | 4.7 | 0.1 | 0.17 |
| 8 | 6 | 65.2 | 11 | 0.12 | 0.48 |
| 9 | 4.56 | 85.7 | 6.3 | 0.1 | 0.32 |
| 10 | 6.1 | 67 | 14.2 | 0.12 | 0.27 |
| 11* | 6.6 | 86.7 | 3.4 | 0.1 | 0.59 |
| 12* | 7.3 | 69.2 | 10 | 0.12 | 0.07 |

*7 LAYER STRUCTURE (OTHERS - 5 LAYER STRUCTURE)

<Heat Resisting Property Test>

Heat resisting property tests were performed on the low-E glass samples 7 to 12. The heat resisting property test was conducted by performing a thermal process on each low-E glass sample for 3 minutes in an air atmosphere of 730° C.

The sheet resistance, the emissivity, and the haze rate of each of the low-E glass samples were measured after performing the thermal process on each of the low-E glass samples.

In measuring the sheet resistance, a sheet resistance measuring device (manufactured by Delcom Instruments Inc., 717B Conductance monitor) was used.

Further, in measuring the emissivity, an emissivity measuring device (manufactured by Japan Sensor Inc., TSS-5X) was used to obtain the emissivity ε (%) at the wavelength region of 2 μm to 22 μm. The sheet resistance Rs and the emissivity ε of the low-E glass samples 7 to 12 increase as the third layer (and the fourth layer) oxidizes. Therefore, the sheet resistance Rs and the emissivity ε can be used as indices for evaluating the protective property of the silica film.

Further, in measuring the haze rate, a haze rate measuring device (manufactured by Suga Test Instruments Co., Ltd, Hz-2) was used and a double-beam method was performed with a D65 light source. The term "haze rate" refers to an index that quantitatively indicates the level in which haziness occurs in the sample. When the third layer of each of the low-E glass samples 7 to 12 is degraded by heat, the third layer tends to cohere. Therefore, the haze rate can be used as an index for evaluating the protective property of the silica film.

Further, the visible light transmittance Tv of each sample was measured by using a spectrophotometer (manufactured by Hitachi Ltd., U4100) with a similar method as the above-described preliminary test 2 to obtain the change amount ΔTv of the visible light transmittance Tv of the samples before and after performing the thermal process. The ΔTv of the low-E glass samples 7 to 12 increases as the third and fourth layers oxidize. Therefore, the ΔTv can be used as an index for evaluating the protective property of the silica film.

The results of the measuring of each of the low-E glass samples 7 to 12 are shown in the above-described Table 4.

According to the results shown in Tables 3 and 4, it can be understood that emissivity ε (%) after performing the thermal process on the low-E glass samples 7 to 12 can be significantly restrained compared to those of the low-E glass samples 4 to 6 in which the emissivity of each of the low-E glass samples 7 to 12 is less than 0.15.

According to these results, it is confirmed that the fifth layer including the silica film of the low-E glass samples 7 to 12 exhibit a satisfactory oxygen barrier property.

Further, according to the measurement results, it can be understood that haze rate after performing the thermal process on the low-E glass samples 7 to 12 can be significantly restrained compared to those of the low-E glass samples 4 to 6 in which the haze rate of each of the low-E glass samples 7 to 12 is less than 0.7%.

The results show that the third layer of the low-E glass samples 7 to 12 tend to exhibit less cohesiveness. That is, the third layer is not significantly degraded by the thermal process. Therefore, it can be understood that degradation by heat of the low-E glass samples 7 to 12 is restrained compared to those of the low-E glass samples 4 to 6.

Further, it can be understood that the change amount Δ Tv of the transmittance before and after performing the thermal process on the low-E glass samples 7 to 12 can be significantly restrained compared to those of the low-E glass samples 4 to 6 in which the change amount Δ Tv of the transmittance before and after performing the thermal process on the low-E glass samples 7 to 12 is less than 15%.

These results shows that oxidization by the thermal process performed on the third and fourth layers of the low-E glass samples 7 to 12 is restrained. According to these result, the fifth layer including the silica film of the low-E glass samples 7 to 12 exhibit a satisfactory oxygen barrier property.

With the low-E glass samples 7 to 12 including a silica layer having a refractive index "n" greater than or equal to 1.467 and an extinction coefficient "k" less than or equal to $1 \times 10^{-4}$ at a wavelength of 632 nm, and a carbon content less than or equal to 3 atomic %, a satisfactory oxygen barrier property can be attained compared to the low-E glass samples 4 to 6 having a fourth layer including a silica film having a refractive index "n" to a degree of 1.46.

<Low-E Glass Sample 15>

A low-E glass sample (low-E glass sample 15) was fabricated as follows.

First, a glass substrate was prepared. The glass substrate is a soda-lime glass having a dimension of 100 mm in height×100 mm in width×6 mm in thickness.

A first layer (target thickness 35 nm), a second layer (target thickness 16 nm), a third layer (target thickness 15 nm), a fourth layer (target thickness 30 nm), a fifth layer (target thickness 53 nm), a sixth layer (target thickness 19 nm), a seventh layer (target thickness 5 nm), an eighth layer (target thickness 23 nm), and a ninth layer (target thickness 5 nm) were sequentially deposited on one surface of the glass substrate. Thereby, the low-E glass sample 15 was fabricated.

The first layer includes an aluminum doped zinc oxide. The second layer includes silver. The third layer includes a nitride of nickel and silicon. The fourth layer includes silica. The fifth layer includes an aluminum doped zinc oxide. The sixth layer includes silver. The seventh layer includes titanium. The eighth layer includes an aluminum doped zinc oxide. The ninth layer includes silicon nitride.

Among these layers, the first to third layers, and the fifth to ninth layers were deposited by the following sputtering method.

First, an aluminum doped zinc oxide film was deposited on the glass substrate by using a zinc target doped with aluminum of 5 atomic % and performing a DC reactive sputtering method thereon. An argon gas (flow rate of 30 sccm) and an oxygen gas (flow rate of 70 sccm) were used as the sputtering gas. A power of 0.5 kW was supplied.

Then, after exhausting the remaining gas, a silver film was deposited on the aluminum doped zinc oxide film by using a silver target and performing a DC sputtering method thereon. An argon gas (flow rate of 100 sccm) was used as the sputtering gas. A power of 0.1 kW was supplied.

Then, a nitride film of nickel and silicon was deposited on the silver film by using an alloy target including nickel of 80% by weight and silicon of 20% by weight and performing a pulse DC sputtering method thereon. An argon gas (flow rate of 50 sccm) and a nitrogen gas (flow rate of 50 sccm) were used as the sputtering gas. A power of 0.2 kW was supplied, and the frequency was 20 kHz.

Then, the fourth layer made of silica was deposited by performing a plasma CVD method. The conditions for performing the plasma CVD method were the same conditions used when depositing the first silica film in the above-described sample 3 of the preliminary test. Therefore, the fourth layer has a refractive index "n" of 1.469 and extinction coefficient "k" less than $1\times10^{-7}$ at a wavelength of 632 nm, and a carbon content less than or equal to the detection limit.

Then, after exhausting the remaining gas, an aluminum doped zinc oxide film was deposited by using a zinc target doped with aluminum of 5 atomic % and performing a DC reactive sputtering method thereon. An argon gas (flow rate of 30 sccm) and an oxygen gas (flow rate of 70 sccm) were used as the sputtering gas. A power of 0.5 kW was supplied.

Then, after exhausting the remaining gas, a silver film was deposited by using a silver target and performing a DC sputtering method thereon. An argon gas (flow rate of 100 scam) was used as the sputtering gas. A power of 0.1 kW was supplied.

Then, a titanium film was deposited by using a titanium metal target and performing a DC sputtering method thereon. An argon gas (flow rate of 100 scam) was used as the sputtering gas. A power of 0.1 kW was supplied.

Then, after exhausting the remaining gas, an aluminum doped zinc oxide film was deposited by using a zinc target doped with aluminum of 5 atomic % and performing a DC reactive sputtering method thereon. An argon gas (flow rate of 30 sccm) and an oxygen gas (flow rate of 70 sccm) were used as the sputtering gas. A power of 0.5 kW was supplied.

Then, a silicon nitride film was deposited by using a metal silicon target (a boron-doped polycrystalline target, silicon content of 99.999% by mass) and performing a pulse DC reactive sputtering method thereon. A nitrogen gas (flow rate of 30 sccm) and an argon gas (flow rate of 70 sccm) were used as the sputtering gas. A power of 0.5 kW is supplied, and the frequency is 20 kHz.

<Low-E Glass Sample 16>

A low-E glass sample (low-E glass sample 16) having a similar layer configuration as the low-E glass sample 15 was fabricated. However, the low-E glass sample 16 was fabricated to have a first layer (target thickness 40 nm), a second layer (target thickness 15 nm), a third layer (target thickness 15 nm), a fourth layer (target thickness 20 nm), a fifth layer (target thickness 65 nm), a sixth layer (target thickness 18.5 nm), a seventh layer (target thickness 5 nm), an eighth layer (target thickness 25 nm), and a ninth layer (target thickness 5 nm) being sequentially deposited on one surface of the glass substrate. Further, the third layer was a nitride film of nickel and aluminum. The nitride film of nickel and aluminum was deposited on the silver film by using an alloy target including nickel of 50% by mass and aluminum of 50% by mass and performing a pulse DC reactive sputtering method thereon.

The other deposition conditions were the same as the low-E glass sample 15.

<Low-E Glass Sample 17>

A low-E glass sample (low-E glass sample 17) having a similar layer configuration as the low-E glass sample 15 was fabricated. However, the low-E glass sample 17 was fabricated to have a first layer (target thickness 35 nm), a second layer (target thickness 16 nm), a third layer (target thickness 10 nm), a fourth layer (target thickness 20 nm), a fifth layer (target thickness 60 nm), a sixth layer (target thickness 19 nm), a seventh layer (target thickness 5 nm), an eighth layer (target thickness 25 nm), and a ninth layer (target thickness 5 nm) being sequentially deposited on one surface of the glass substrate. Further, the third layer was a nitride film of titanium and aluminum. The nitride film of titanium and aluminum was deposited on the silver film by using an alloy target including titanium of 90% by mass and aluminum of 10% by mass and performing a pulse DC reactive sputtering method thereon.

The other deposition conditions were the same as the low-E glass sample 15.

The following Table 5 collectively shows the fabrication conditions of the fourth layer of the low-E glass samples 15 to 17 along with their refractive indices "n", extinction coefficients "k", and carbon content.

TABLE 5

| LOW-E GLASS SAMPLE | DEPOSITION METHOD OF $4^{TH}$ LAYER | DEPOSITION PRESSURE (Pa) | DEPOSITION POWER DENSITY (kW/m) | REFRACTIVE INDEX OF $4^{TH}$ LAYER n | EXTINCTION COEFFICIENT OF $4^{TH}$ LAYER k | C CONTENT OF $4^{TH}$ LAYER (%) |
|---|---|---|---|---|---|---|
| 15 | PLASMA CVD METHOD | 0.35 | 80 | 1.469 | LESS THAN $1 \times 10^{-7}$ | N.D. |
| 16 | PLASMA CVD METHOD | 0.35 | 80 | 1.469 | LESS THAN $1 \times 10^{-7}$ | N.D. |
| 17 | PLASMA CVD METHOD | 0.35 | 80 | 1.469 | LESS THAN $1 \times 10^{-7}$ | N.D. |

| LOW-E GLASS SAMPLE | TRANSMITTANCE OF VISIBLE LIGHT AFTER THERMAL PROCESS Tv (%) | TRANSMITTANCE OF ENERGY AFTER THERMAL PROCESS Te (%) | REFLECTANCE OF VISIBLE LIGHT OF EXTERNAL SIDE AFTER THERMAL PROCESS Rvout (%) | REFLECTANCE OF VISIBLE LIGHT OF INTERNAL SIDE AFTER THERMAL PROCESS Rv in (%) |
|---|---|---|---|---|
| 15 | 45.4 | 21 | 18.5 | 11.5 |
| 16 | 46.9 | 21.1 | 18 | 12.2 |
| 17 | 48.1 | 21.3 | 15.9 | 10.8 |

<Low-E Glass Sample 18>

A low-E glass sample (low-E glass sample 18) was fabricated as follows.

First, a glass substrate was prepared. The glass substrate was a soda-lime glass having a dimension of 100 mm in height×100 mm in width×6 mm in thickness.

A first layer (target thickness 40 nm), a second layer (target thickness 12.5 nm), a third layer (target thickness 5 nm), a fourth layer (target thickness 85 nm), a fifth layer (target thickness 19 nm), a sixth layer (target thickness 16 nm), and a seventh layer (target thickness 25 nm) were sequentially deposited on one surface of the glass substrate. Thereby, the low-E glass sample 18 was fabricated.

The first layer includes an aluminum doped zinc oxide. The second layer includes silver. The third layer includes a titanium. The fourth layer includes an aluminum doped zinc oxide. The fifth layer includes silver. The sixth layer includes a nitride of nickel and silicon. The seventh layer includes silica.

Among these layers, the first to sixth layers were deposited by the following sputtering method.

First, an aluminum doped zinc oxide film was deposited on the glass substrate by using a zinc target doped with aluminum of 5 atomic % and performing a DC reactive sputtering method thereon. An argon gas (flow rate of 30 sccm) and an oxygen gas (flow rate of 70 sccm) were used as the sputtering gas. A power of 0.5 kW was supplied.

Then, after exhausting the remaining gas, a silver film was deposited on the aluminum doped zinc oxide film by using a silver target and performing a DC sputtering method thereon. An argon gas (flow rate of 100 sccm) was used as the sputtering gas. A power of 0.1 kW was supplied.

Then, a titanium film was deposited by using a titanium metal target and performing a DC sputtering method thereon. An argon gas (flow rate of 100 sccm) was used as the sputtering gas. A power of 0.1 kW was supplied.

Then, after exhausting the remaining gas, an aluminum doped zinc oxide film was deposited by using a zinc target doped with aluminum of 5 atomic % and performing a DC reactive sputtering method thereon. An argon gas (flow rate of 30 sccm) and an oxygen gas (flow rate of 70 sccm) were used as the sputtering gas. A power of 0.5 kW was supplied.

Then, after exhausting the remaining gas, a silver film was deposited by using a silver target and performing a DC sputtering method thereon. An argon gas (flow rate of 100 sccm) was used as the sputtering gas. A power of 0.1 kW is supplied.

Then, after exhausting the remaining gas, a nitride film of nickel and silicon was deposited on the silver film by using an alloy target including nickel of 80% by weight and silicon of 20% by weight and performing a pulse DC sputtering method thereon. An argon gas (flow rate of 50 sccm) and a nitrogen gas (flow rate of 50 sccm) were used as the sputtering gas. A power of 0.2 kW was supplied, and the frequency was 20 kHz.

Then, the seventh layer made of silica was deposited by performing a plasma CVD method. The conditions for performing the plasma CVD method were the same conditions used when depositing the first silica film in the above-described sample 3 of the preliminary test 2. Therefore, the fourth layer has a refractive index "n" of 1.469 and extinction coefficient "k" less than $1\times10^{-7}$ at a wavelength of 632 nm, and a carbon content that is less than or equal to the detection limit.

<Low-E Glass Sample 19>

A low-E glass sample (low-E glass sample 19) having a similar layer configuration as the low-E glass sample 18 was fabricated. However, the low-E glass sample 19 was fabricated to have a fifth layer having a target thickness of 14.5 nm, a sixth layer having a target thickness of 10 nm, and a seventh layer having a target thickness of 30 nm. The target thicknesses of the other layers were the same as those of the low-E glass sample 18. Further, the sixth layer was a nitride film of nickel and aluminum. The nitride film of nickel and aluminum was deposited on the silver film by using an alloy target including nickel of 50% by mass and aluminum of 50% by mass and performing a pulse DC reactive sputtering method thereon.

The other deposition conditions were the same as the low-E glass sample 18.

<Low-E Glass Sample 20>

A low-E glass sample (low-E glass sample 20) having a similar layer configuration as the low-E glass sample 18 was fabricated. However, the low-E glass sample was fabricated to have a fifth layer having a target thickness of 18 nm and a sixth layer having a target thickness of 11 nm. The target thicknesses of the other layers were the same as those of the low-E glass sample 18. Further, the sixth layer was a nitride film of titanium and aluminum. The nitride film of titanium and aluminum was deposited on the silver film by using an alloy target including titanium of 90% by mass and aluminum of 10% by mass and performing a pulse DC reactive sputtering method thereon.

The other deposition conditions were the same the low-E glass sample 18.

The following Table 6 collectively shows the fabrication conditions of the seventh layer of the low-E glass samples 18 to 20 along with their refractive indices "n", extinction coefficients "k", and carbon content.

TABLE 6

| LOW-E GLASS SAMPLE | DEPOSITION METHOD OF 7$^{TH}$ LAYER | DEPOSITION PRESSURE (Pa) | DEPOSITION POWER DENSITY (kW/m) | REFRACTIVE INDEX OF 7$^{TH}$ LAYER n | EXTINCTION COEFFICIENT OF 7$^{TH}$ LAYER k | C CONTENT OF 7$^{TH}$ LAYER (%) |
|---|---|---|---|---|---|---|
| 18 | PLASMA CVD METHOD | 0.35 | 80 | 1.469 | LESS THAN $1\times10^{-7}$ | N.D. |
| 19 | PLASMA CVD METHOD | 0.35 | 80 | 1.469 | LESS THAN $1\times10^{-7}$ | N.D. |
| 20 | PLASMA CVD METHOD | 0.35 | 80 | 1.469 | LESS THAN $1\times10^{-7}$ | N.D. |

TABLE 6-continued

| LOW-E GLASS SAMPLE | TRANSMITTANCE OF VISIBLE LIGHT AFTER THERMAL PROCESS Tv (%) | TRANSMITTANCE OF ENERGY AFTER THERMAL PROCESS Te (%) | REFLECTANCE OF VISIBLE LIGHT OF EXTERNAL SIDE AFTER THERMAL PROCESS Rvout (%) | REFLECTANCE OF VISIBLE LIGHT OF INTERNAL SIDE AFTER THERMAL PROCESS Rv in (%) |
|---|---|---|---|---|
| 18 | 42.7 | 20.8 | 14.5 | 21.7 |
| 19 | 40.6 | 20.2 | 13.4 | 29.0 |
| 20 | 43.7 | 20.4 | 14.0 | 23.1 |

<Heat Resisting Property Test>

Heat resisting property tests were performed on the low-E glass samples 15 to 20. The heat resisting property test was conducted by performing a thermal process on each low-E glass sample for 9 minutes in an air atmosphere of 730° C.

<Optical Calculation of Low-E Glass Pair Configuration>

The spectral transmittance and the spectral reflectance at a wavelength region of 250 nm to 2500 nm was measured by using a spectrophotometer (manufactured by Hitachi Ltd., U4100) after performing the thermal process on each low-E glass sample.

Then, the low-E glass performance (visible light transmittance Tv, energy transmittance Te, visible light reflectance on an outdoor side Rvout, visible light reflectance on an indoor side Rvin) as a pair configuration was calculated by using the measurement results of the spectral transmittance and reflectance. A glass pair configuration according to an embodiment of the present invention is a low-E glass including a soda-lime glass substrate being provided on an indoor side and having a thickness of 6 mm and another soda-lime glass substrate being provided on an outdoor side (sunlight side) and having a thickness of 6 mm The other deposition conditions are the same the mirror sample 3. An air layer of 12 mm is provided between both glass substrates. The low-E glass performance of the pair configuration is calculated in conformity with ISO 9050-2003.

The above-described Tables 5 and 6 show the values of the visible light transmittance Tv, the energy transmittance Te, the visible light reflectance Rvout on the outdoor side, and the visible light reflectance Rvin on the indoor side after the thermal process is performed on each glass pair including the low-E glass samples 15-20.

The third layers of samples 15 and 16 have a light absorption property because a nickel nitride is included in the third layer. However, when the third layer is oxidized by a thermal process, the light absorption property is reduced and becomes closer to a transparent film. However, because the fourth layer being provided on an upper part of the third layer and including a silica film has a satisfactory oxygen barrier property, the third layer is prevented from being oxidized during the thermal process to maintain its light absorption property. Thereby, the visible light transmittance Tv of samples 15 and 16 is less than or equal to 50% and the energy transmittance Te of samples 15 and 16 is less than or equal to 22% after the thermal process. Accordingly, it can be understood that the increase of transmittance due to oxidization of the third layer can be prevented. Further, the reflectance of the samples 15 and 16 is less than or equal to 20%. Accordingly, it can be understood that the reflectance can be maintained to be low in correspondence with the absorption of solar light.

Next, although the third layer of sample 17 has a light absorbing property due to the titanium nitride included in the third layer, the titanium nitride included in the third layer is prevented from oxidizing and maintains its light absorption property because the silica film included in the fourth layer has a satisfactory oxygen barrier property. Thus, the Tv, Te, Rvout, and Rvin can be maintained to be low.

Similarly, although the sixth layers of samples 18 and 19 each has a light absorbing property due to the nickel nitride included in the sixth layer, the sixth layer is prevented from oxidizing and maintains its light absorption property because the silica film included in the seventh layer has a satisfactory oxygen barrier property. Thus, the Tv, Te, and Rvout can be maintained to be low. Further, although the sixth layers of samples 18 and 19 each has a light absorbing property due to the nickel nitride included in the sixth layer, the sixth layer is prevented from oxidizing during the thermal process and maintains its light absorption property because the silica film included in the seventh layer has a satisfactory oxygen barrier property. Similarly, although the sixth layer of sample 20 has a light absorbing property due to the titanium nitride included in the sixth layer, the sixth layer is prevented from oxidizing during the thermal process and maintains its light absorption property because the silica film included in the seventh layer has a satisfactory oxygen barrier property. Thus, the Tv, Te, and Rvout can be maintained to be low.

<Heat Resisting Property Test of Mirror Sample>

According to the results of the preliminary tests, it is confirmed that a silica film has a satisfactory oxygen barrier property when the refractive index "n" of the silica film exceeds 1.467. Next, a mirror sample having a configuration of an actual mirror apparatus is fabricated. Further, the heat resisting property of each sample is evaluated.

<Mirror Sample 1>

A mirror sample (mirror sample 1) was fabricated as follows.

First, a glass substrate was prepared. The glass substrate has a dimension of 100 mm in height×100 mm in width×3 mm in thickness. The glass substrate is a non-alkali glass having a $Na_2O$ content of 0% by mass. A first layer (target thickness 20 nm), a second layer (target thickness 120 nm), a third layer (target thickness 2.2 nm), a fourth layer (target thickness 50 nm), and a fifth layer (target thickness 50 nm) were sequentially deposited on one surface of the glass substrate. Thereby, the mirror sample 1 having a layer configuration illustrated in FIG. 3 was fabricated.

The first layer includes an aluminum doped zinc oxide. The second layer includes a silver alloy having a gold content of 1% by mass. The third layer includes an aluminum doped zinc. The fourth layer includes silica. The fifth layer includes silicon nitride.

Among these layers, the first to third layers, and the fifth layer were deposited by a regular sputtering method.

First, an aluminum doped zinc oxide film was deposited on the glass substrate by using a zinc target doped with aluminum of 5 atomic % and performing a DC reactive sputtering method thereon. An argon gas (flow rate of 60 sccm) and an oxygen gas (flow rate of 140 scam) were used as the sputtering gas. A power of 0.5 kW was supplied.

Then, after exhausting the remaining gas, a silver alloy film was deposited on the glass substrate formed with the aluminum doped zinc oxide film by using a silver alloy target containing gold of 1% by mass and performing a DC sputtering method thereon. An argon gas (flow rate of 200 scam) was used as the sputtering gas. A power of 0.9 kW was supplied.

Then, an aluminum doped zinc film was deposited on the silver alloy film by using a zinc target doped with aluminum of 5 atomic % and performing a DC sputtering method thereon. An argon gas (flow rate 200 sccm) was used as the sputtering gas. A power of 0.05 kW was supplied.

Then, the fourth layer made of silica was deposited by performing a plasma CVD method. The conditions for performing the plasma CVD method were the same conditions used when depositing the second silica film in the above-described sample 2 of the preliminary test. Therefore, the fourth layer has a refractive index "n" of 1.4773 and extinction coefficient "k" less than $1 \times 10^{-7}$ at a wavelength of 632 nm, and a carbon content less than or equal to the detection limit.

Then, after exhausting the remaining gas, a silicon nitride film was deposited by using a metal silicon target (boron doped polycrystalline target, silicon content of 99.999% by mass) and performing a pulse DC reactive sputtering method thereon. A nitride gas (flow rate of 60 scam) and an argon gas (flow rate of 14 scam) were used as the sputtering gas. A power of 1 kW was supplied, and the frequency was 20 kHz.

<Mirror Sample 2>

A mirror sample including a similar layer configuration as the mirror sample 1 (mirror sample 2) was fabricated. However, the fourth layer of the mirror sample 2 was deposited by a plasma CVD method. The conditions for performing the plasma CVD method were the same conditions used when depositing the second silica film in the above-described sample 3 of the preliminary test 2. Therefore, the fourth layer has a refractive index "n" of 1.469 and an extinction coefficient "k" less than $1 \times 10^{-7}$ at a wavelength of 632 nm, and a carbon content less than or equal to the detection limit.

The other deposition conditions were the same as the mirror sample 1.

<Mirror Sample 3>

A mirror sample including a similar layer configuration as the mirror sample 1 (mirror sample 3) was fabricated. However, the fourth layer (i.e., silica film) of the mirror sample 3 was deposited by a regular sputtering method. The conditions for performing the sputtering method were the same conditions used when depositing the second silica film in the above-described sample 5 of the preliminary test 2. Therefore, the fourth layer has a refractive index "n" of 1.4602 and an extinction coefficient "k" less than $1 \times 10^{-7}$ at a wavelength of 632 nm.

The fifth layer of the mirror sample 3 includes titanium dioxide (target thickness of 50 nm) instead of silicon nitride.

The other deposition conditions are the same as the mirror sample 1.

<Mirror Sample 4>

A mirror sample including a similar layer configuration as the mirror sample 3 (mirror sample 4) is fabricated. However, the fifth layer of the mirror sample 4 includes silicon nitride (target thickness of 50 nm) instead of titanium dioxide.

The other deposition conditions are the same as the mirror sample 3.

Table 7 collectively shows the fabrication conditions of the fourth layer of the mirror samples 1 to 4 along with their refractive indices "n", extinction coefficients "k", and the material of the fifth layer.

TABLE 7

| MIRROR SAMPLE | DEPOSITION METHOD OF 4$^{TH}$ LAYER | DEPOSITION PRESSURE (Pa) | REFRACTIVE INDEX OF 4$^{TH}$ LAYER n | EXTINCTION COEFFICIENT OF 4$^{TH}$ LAYER k | C CONTENT OF 4$^{TH}$ LAYER (%) | 5$^{TH}$ LAYER | REFLECTANCE OF ENERGY Re (%) | EXTERNAL OBSERVATION RESULT |
|---|---|---|---|---|---|---|---|---|
| 1 | PLASMA CVD METHOD | 0.56 | 1.4773 | LESS THAN $1 \times 10^{-7}$ | N.D. | SiN | 94.85 | TRANSPARENT |
| 2 | PLASMA CVD METHOD | 0.35 | 1.469 | LESS THAN $1 \times 10^{-7}$ | N.D. | SiN | 95.4 | TRANSPARENT |
| 3 | SPUTTER METHOD | 0.27 | 1.4602 | LESS THAN $1 \times 10^{-7}$ | N.D. | TiO$_2$ | 91.22 | TURBIDITY FOUND |
| 4 | SPUTTER METHOD | 0.27 | 1.4602 | LESS THAN $1 \times 10^{-7}$ | N.D. | SiN | 92.93 | TURBIDITY FOUND |

<Heat Resisting Property Test>

Heat resisting property tests are performed on the mirror samples 1 to 4. The heat resisting property test is conducted by performing a thermal process on each mirror sample for 3 hours in an atmosphere of 500° C.

The reflectance of solar energy Re of each mirror sample is measured after performing the thermal process on each mirror sample. The solar energy reflectance Re is a value that is calculated in conformity with ISO 9050-2003. More specifically, the solar energy reflectance Re refers to a weighted average obtained by multiplying the measured absolute spectral reflectance (300 nm to 2500 nm) with a weighting coefficient including an average spectral distribution of sunshine. Further, the appearance of each mirror sample after performing the thermal process is observed by visual inspection.

The results of the heat resisting property test of each mirror sample are shown in the above-described Table 7.

According to the results shown in Table 7, the mirror samples 1 and 2 after the thermal process have a significantly high energy reflectance Re compared to those of the mirror samples 3 and 4. Further, haziness is recognized in the mirror samples 3 and 4 after the thermal process. On the other hand, no particular irregularity is recognized from the appearances of the mirror samples 1 and 2.

With the mirror samples 1 and 2 including a fourth layer having a silica film having a refractive index "n" that is greater than or equal to 1.466 and an extinction coefficient "k" that is less than or equal to $1\times10^{-4}$ in a wavelength region of 632 nm, and a carbon content that is less than or equal to 3 atomic %, a satisfactory heat resisting property can be attained compared to the mirror samples 3 and 4 including a fourth layer having a silica film having a refractive index "n" to a degree of 1.46.

INDUSTRIAL APPLICABILITY

The present invention may be used, for example, in a low-E glass having low emissivity. Further, the present invention may be used, for example, in a secondary mirror of a linear Fresnel type or tower type solar power generation system.

The invention claimed is:

1. A protective film, comprising:
   a silica film having a thickness of 1500 Å or less,
   wherein the silica film has an extinction coefficient "k" less than or equal to $1\times10^{-4}$ at a wavelength of 632 nm, a refractive index "n" greater than or equal to 1.466 at a wavelength of 632 nm and a carbon content less than or equal to 3 atomic %.

2. A method for producing the protective film of claim 1 provided on an upper part of a metal film placed on a glass substrate, the method comprising:
   depositing a metal reflective film on an upper part of the glass substrate; and
   depositing the silica film on an upper part of the metal reflective film;
   wherein the depositing the silica film is performed by a plasma CVD method in a condition in which a pressure is less than or equal to 2 Pa.

3. The method as claimed in claim 2,
   wherein the depositing the metal reflective film is performed by a sputtering method.

4. The method as claimed in claim 3,
   wherein the depositing the metal reflective film and the depositing the silica film are performed by an inline method.

5. The method as claimed in claim 2, wherein the metal reflective film comprises a silver or a silver alloy.

6. The method as claimed in claim 2, further comprising:
   forming a film that has a refractive index higher than the silica film on an upper part of the silica film.

7. The method as claimed in claim 6,
   wherein the film having a refractive index higher than the silica film is a silicon nitride film.

8. The protective film as claimed in claim 1, wherein the silica film has a thickness ranging from 50 to 1500 Å.

9. A reflective member, comprising:
   a glass substrate;
   a metal reflective film; and
   a protective film,
   wherein the protective film comprises a silica film having a thickness of 1500 Å or less,
   wherein the silica film has an extinction coefficient "k" less than or equal to $1\times10^{-4}$ at a wavelength of 632 nm, a refractive index "n" greater than or equal to 1.466 at a wavelength of 632 nm and a carbon content less than or equal to 3 atomic %.

10. The reflective member as claimed in claim 9,
    wherein the metal reflective film comprises silver or a silver alloy.

11. The reflective member as claimed in claim 9, further comprising:
    a single film provided between the glass substrate and the metal reflective film, and
    wherein the single film is selected from the group consisting of a metal nitride, a metal oxide, and a metal oxynitride.

12. The reflective member as claimed in claim 9,
    wherein a film having a refractive index higher than the silica film is provided on a side of the silica film that is opposite from the metal reflective film.

13. The reflective member as claimed in claim 12,
    wherein the film having a refractive index higher than the silica film is a silicon nitride film.

14. The reflective member as claimed in claim 9,
    wherein the glass substrate comprises a glass having a sodium oxide content of equal to or less than 4% by mass.

15. A low-E glass comprising:
    the reflective member as claimed in claim 9.

16. A secondary mirror of a solar energy generating system comprising:
    the reflective member as claimed in claim 9.

17. The reflective member as claimed in claim 9, wherein on an upper part of the glass substrate, the metal reflective film and the protective film are arranged in this order.

18. The reflective member as claimed in claim 9, wherein the silica film has a thickness ranging from 50 to 1500 Å.

* * * * *